United States Patent
Yamauchi

(10) Patent No.: US 9,460,660 B2
(45) Date of Patent: Oct. 4, 2016

(54) PIXEL CIRCUIT AND DISPLAY DEVICE

(71) Applicant: Sharp Kabushiki Kaisha, Osaka-shi, Osaka (JP)

(72) Inventor: Yoshimitsu Yamauchi, Osaka (JP)

(73) Assignee: SHARP KABUSHIKI KAISHA, Osaka-shi (JP)

( * ) Notice: Subject to any disclaimer, the term of this patent is extended or adjusted under 35 U.S.C. 154(b) by 20 days.

(21) Appl. No.: 14/366,089

(22) PCT Filed: Dec. 6, 2012

(86) PCT No.: PCT/JP2012/081617
§ 371 (c)(1),
(2) Date: Jun. 17, 2014

(87) PCT Pub. No.: WO2013/094422
PCT Pub. Date: Jun. 27, 2013

(65) Prior Publication Data
US 2014/0361960 A1     Dec. 11, 2014

(30) Foreign Application Priority Data

Dec. 21, 2011   (JP) ................................. 2011-279284

(51) Int. Cl.
G09G 3/3233        (2016.01)
G09G 3/32          (2016.01)
H01L 51/52         (2006.01)

(52) U.S. Cl.
CPC .... *G09G 3/3233* (2013.01); *G09G 2300/0413* (2013.01); *G09G 2300/0819* (2013.01); *G09G 2300/0842* (2013.01);
(Continued)

(58) Field of Classification Search
CPC ............................................. G09G 2300/0413
See application file for complete search history.

(56) References Cited

U.S. PATENT DOCUMENTS

2005/0052350 A1*   3/2005   Mizukoshi et al. ............ 345/55
2006/0017672 A1*   1/2006   Aoki ............................... 345/77
(Continued)

FOREIGN PATENT DOCUMENTS

JP    2005-534990    11/2005
JP    2007-148129     6/2007
(Continued)

OTHER PUBLICATIONS

International Search Report, mailed on Mar. 5, 2013, directed to International Application No. PCT/JP2012/081617; 2 pgs.

*Primary Examiner* — Kathy Wang-Hurst
*Assistant Examiner* — Matthew Yeung
(74) *Attorney, Agent, or Firm* — Morrison & Foerster LLP

(57) ABSTRACT

A pixel circuit includes: a light emitting element; an n-channel drive transistor T1 that has a source connected with an anode of the light emitting element, a gate connected with a pixel node, and controls a light emission current flowing in the light emitting element in accordance with a light emission control voltage between the gate and the source; a transfer transistor T2 which is interposed between a data signal line and the pixel node, and has a gate connected with a scan signal line; a control transistor T3 which is interposed between the source and a drain of the drive transistor T1, has a gate connected with the scan signal line, and comes into an ON state simultaneously with the transfer transistor T2; and a capacitance element which is interposed between the gate and the source of the drive transistor T1, and holds the light emission control voltage.

20 Claims, 15 Drawing Sheets

(52) U.S. Cl.
CPC .............. *G09G 2320/0233* (2013.01); *G09G 2320/045* (2013.01); *H01L 51/5218* (2013.01); *H01L 51/5265* (2013.01); *H01L 2251/558* (2013.01)

(56) References Cited

U.S. PATENT DOCUMENTS

| 2006/0113919 | A1 | 6/2006 | Childs et al. |
| 2007/0268210 | A1 | 11/2007 | Uchino et al. |
| 2008/0238834 | A1* | 10/2008 | Matsuo et al. .................. 345/76 |
| 2009/0294163 | A1* | 12/2009 | Yamamoto et al. .......... 174/261 |
| 2009/0295772 | A1 | 12/2009 | Kim et al. |
| 2011/0025671 | A1* | 2/2011 | Lee ........................ G09G 3/003 345/211 |

FOREIGN PATENT DOCUMENTS

| JP | 2007-310311 | 11/2007 |
| WO | WO-2004/015667 | 2/2004 |

\* cited by examiner

US 9,460,660 B2

PIXEL CIRCUIT AND DISPLAY DEVICE

CROSS-REFERENCE TO RELATED APPLICATIONS

This application is a National Phase filing under 35 U.S.C. §371 of International Application No. PCT/JP2012/081617, filed on Dec. 6, 2012, which claims priority to Japanese Patent Application No. 2011-279284 filed on Dec. 21, 2011.

FIELD OF THE INVENTION

The present invention relates to a pixel circuit and a display device that includes the pixel circuit, and the present invention particularly relates to a pixel circuit including: a light emitting element which emits light by a light emission current flowing from an anode electrode to a cathode electrode; and an n-channel insulated gate thin-film transistor which controls the light emission current, and a display device that includes a pixel circuit array formed by arranging the pixel circuits in a matrix form, the present invention more specifically relating to an active matrix organic EL display device.

BACKGROUND OF THE INVENTION

In the organic EL display device, a light emission current flowing in an OLED (Organic Light Emitting Diode) as an organic EL element is controlled to adjust light emission luminance. The active matrix organic EL display device includes, within a pixel circuit, a drive transistor which controls the light emission current with a gate voltage to drive the OLED, and a transfer transistor which transfers to a gate electrode of the drive transistor a luminance voltage that is supplied from a data signal line and serves to adjust light emission luminance on multiple-gradations. The drive transistor and the transfer transistor are each formed of an insulated gate thin-film transistor (TFT).

A p-channel TFT or an n-channel TFT may be used for the drive transistor, and in the case of using the n-channel TFT, for example, there is generally given a source follower circuit where a source electrode is connected with an anode electrode of the OLED, as shown in FIG. 13 (e.g., see Patent Documents 1, 2, etc.). When the OLED is to be formed on a TFT substrate, in the case of a top emission type which emits light from its upper side, a lower electrode made up of a laminate structure of a reflective metal and a transparent electrode (formed by laminating a transparent electrode on a reflective metal layer) is arranged on the TFT substrate for a micro cavity effect, and in the case of a bottom emission type which emits light from its lower side, with the lower electrode needing to allow light emitted from the light emitting element to pass therethrough, a lower electrode made up of a transparent electrode is arranged on the TFT substrate. However, with a work function of the transparent electrode being large, the transparent electrode is desirably used as an anode electrode so as to realize light emission of the OLED in a stable and highly efficient manner. Therefore, when the drive transistor is the n-channel TFT, a source electrode is connected with the anode electrode arranged on the TFT substrate side. On the other hand, in order to avoid the source follower circuit being given, a cathode electrode using an alkaline metal with a small work function is to be arranged on the TFT substrate in place of the transparent electrode. In this case, there occurs a need for forming the cathode electrode into an extremely thin film, thereby making it difficult to form an organic film of good quality on the cathode electrode and also causing a problem of increasing resistance of the cathode electrode.

PATENT DOCUMENTS

Patent Document 1: Japanese Patent Application Laid-Open No. 2007-310311
Patent Document 2: Japanese Patent Application Laid-Open No. 2007-148129

SUMMARY OF THE INVENTION

The light emission luminance of the OLED is controlled by the light emission current, but in the case of adjusting the light emission current to a predetermined current value, each of the voltage levels of the drain electrode and the gate electrode needs to be set with the source electrode taken as a reference, such that the drive transistor is operated in a saturation region and a drain current has the predetermined current value. A capacitance element C1 interposed between a source electrode and a gate electrode of a drive transistor T1 in FIG. 13 serves to stably hold a voltage VGS1 between the source electrode and the gate electrode throughout a light emission period.

On the other hand, in the case of providing a capacitance element between the drain electrode and the gate electrode, while a voltage VGD1 between the drain electrode and the gate electrode is stably held throughout the light emission period, a voltage of the source electrode is set to a voltage (operating point), with which the drain current of the drive transistor T1 is equal to the light emission current of the OLED, in accordance with characteristics of both elements, and whereby, when the characteristic of either element changes, the operating point moves to cause a change in light emission current, and hence the change in characteristic of the element needs to be suppressed.

In the case of using the p-channel TFT as the drive transistor, a source ground circuit is given, and since a potential of the source electrode of the drive transistor is fixed, it becomes a constant current circuit. On the other hand, as shown in FIG. 13, in the case of the source follower circuit where the drive transistor T1 is the n-channel TFT, since a potential VS1 of the source electrode of the drive transistor T1 changes in accordance with a current-voltage characteristic of the OLED and a transistor characteristic of the drive transistor, it is necessary to compensate variations and temporal changes in characteristics of the OLED and the drive transistor in order to suppress the changes in potential and stably hold the voltage VGS1 between the source electrode and the gate electrode in the above capacitance element C1.

In above Patent Document 1, it is described that in the pixel circuit shown in FIG. 13, in order to compensate variations and changes in threshold voltage and mobility of the drive transistor T1, as shown in a timing diagram of FIG. 14 (corresponding to FIG. 4A of Patent Document 1), a gate potential VG2 of a transfer transistor T2, a drain potential VD1 of the drive transistor T1 and a drain potential VD2 of the transfer transistor T2 are controlled from the outside, thereby to allow adjustment of the voltage VGS1 (=VG1−VS1) between the source electrode and the gate electrode of the drive transistor T1 as an internal node of the pixel circuit to a value obtained by subtracting a correction amount ΔV of the change in mobility of the drive transistor T1 from a sum of a luminance voltage Vin and a threshold voltage Vt1 of the drive transistor T1, as shown in Mathematical Formula 1 below. It is to be noted that in Patent Document 1, the luminance voltage Vin is given not as an absolute value, but as a voltage change (relative value) during a period when the transfer transistor T2 is ON.

$$VGS1 = Vin + Vt1 - \Delta V \quad \text{(Mathematical Formula 1)}$$

However, in an actual pixel circuit, in addition to the capacitance element C1, a parasitic capacitance Cp between the anode electrode and the cathode electrode of the OLED exists in the source electrode of the drive transistor T1, and a parasitic capacitance Cg, obtained by adding up a parasitic capacitance Cg1 between the gate electrode and the drain electrode of the drive transistor T1, a parasitic capacitance Cg2 between the gate electrode and the source electrode of the transfer transistor T2, and the like, exists in the gate electrode of the drive transistor T1.

According to the description of Patent Document 1, since the correction amount $\Delta V$ changes in accordance with the variations in mobility of the drive transistor T1 between the pixel circuits, the variations in mobility can be corrected. However, in association with a change in gate potential VG1 of the drive transistor T1 just by Vin, a source potential VS1 of the drive transistor T1 is applied with a potential change $\{C1/(C1+Cp) \times Vin\}$ due to electrostatic induction via the capacitance element C1, and the potential change thus needs to be added to the correction amount $\Delta V$. Since the potential change occurs in each pixel circuit regardless of variations in mobility, it becomes an error (first error E1) with respect to compensation of the threshold voltage Vt1. It should be noted that the correction amount $\Delta V$ is generated by the drive transistor T1 charging the capacitance element C1 and the parasitic capacitance Cp in a correction period until the transfer transistor T2 is turned off after the gate potential VG1 of the drive transistor T1 has changed just by Vin, and hence the correction amount $\Delta V$ changes depending on a length of the correction period, a magnitude of the parasitic capacitance Cp, a transistor characteristic (threshold voltage, mobility, etc.) of the drive transistor T1, and a magnitude of the luminance voltage Vin. Therefore, the correction amount $\Delta V$ also becomes an error (second error E2) with respect to compensation of the threshold voltage Vt1. Further, when the transfer transistor T2 shifts from an ON state to an OFF state to get the next light emission period started and the source potential VS1 of the drive transistor T1 increases, the gate potential VG1 of the drive transistor T1 also increases due to electrostatic induction via the capacitance element C1. In the description of Patent Document 1, with the existence of the parasitic capacitance Cg ignored, it is assumed that an increase amount $\Delta VS1$ of the source potential VS1 of the drive transistor T1 is equal to an increase amount $\Delta VG1$ of the gate potential VG1. That is, although it is assumed that the voltage VGS1 between the source electrode and the gate electrode of the drive transistor T1 remains unchanged, when the existence of the parasitic capacitance Cg is taken into consideration, the increase amount $\Delta VG1$ decreases from the increase amount $\Delta VS1$ just by $\{Cg/(C1+Cg)\} \times \Delta VS1$, and hence the decrease amount becomes an error (third error E3) with respect to compensation of the threshold voltage Vt1. Therefore, as an error E in total, the errors E1 and E3 occur in addition to the previously expected error E2 ($=\Delta V$), as shown in Mathematical Formula 2 below. Accordingly, the voltage VGS1 between the source electrode and the gate electrode of the drive transistor T1 is actually as shown in Mathematical Formula 3 below.

$$\begin{aligned} E &= E1 + E2 + E3 \\ &= C1/(C1+Cp) \times Vin + \Delta V + \\ &\quad Cg/(C1+Cg) \times \Delta Vs1 \end{aligned} \quad \text{(Mathematical Formula 2)}$$

$$\begin{aligned} VGS1 &= Vin + Vt1 \cdot \Delta V \cdot (E1 + E3) \\ &= Vin + Vt1 \cdot E \end{aligned} \quad \text{(Mathematical Formula 3)}$$

What is problematic here is that, while the above error E1 greatly depends on the parasitic capacitance Cp, the parasitic capacitance Cp changes in accordance with variations in characteristic of an organic EL material, a shape and a size of the OLED, and the like, and further that the increase amount $\Delta VS1$ with the error E3 also changes in accordance with the luminance voltage Vin and the current-voltage characteristic of the OLED. Moreover, since the source potential VS1 before its increase by the increase amount $\Delta VS1$ with the error E3 changes depending on the threshold voltage Vt1 and the errors E1 and E2, the increase amount $\Delta VS1$ also includes an error depending on the threshold voltage Vt1 and the errors E1 and E2, and hence the error E3 also includes an error obtained by multiplying the error depending on the threshold voltage Vt1 and the errors E1 and E2 by a coefficient of Cg/(C1+Cg). Therefore, the coefficient of the threshold voltage Vt1 on the right side of Mathematical Formula 3 is not 1 but C1/(C1+Cg), and an error depending on a magnitude of the threshold voltage Vt1 occurs. Further, as described above, the error E2 ($=\Delta V$) also changes depending on the length of the above correction period, the magnitude of the parasitic capacitance Cp, the transistor characteristic (threshold voltage, mobility, etc.) of the drive transistor T1, and the magnitude of the luminance voltage Vin. Since the voltage VGS1 between the source electrode and the gate electrode of the drive transistor T1 after the shift to the next light emission period changes depending on the condition other than the luminance voltage Vin as thus described, even when the same luminance voltage Vin is inputted, the same light emission current might not be allowed to flow in the OLED. From the above, the voltage VGS1 between the source electrode and the gate electrode of the drive transistor T1, held in the capacitance element C1 during the light emission period, greatly and complexly changes with respect to the same luminance voltage Vin due to the change factor described above, and it is thus necessary to calculate the change and individually correct the luminance voltage Vin to be inputted.

Accordingly, in the pixel circuit of the source follower circuit type provided with two n-channel TFTs shown in FIG. 13, the light emission current is greatly affected by the parasitic capacitances Cp, Cg that are parasitic on the source electrode and the gate electrode of the drive transistor T1. That is, in compensation of variations and temporal change in characteristic of the drive transistor in Patent Document 1, the major premise is that the parasitic capacitance Cp is extremely larger than the capacitance element C1 (Cp>>C1) and the parasitic capacitance Cg is extremely smaller than the capacitance element C1 (Cg<<C1), but as the precision of pixels becomes higher, such a premise is to be broken to cause large deterioration in compensation precision.

As shown in FIG. 15, the pixel circuit disclosed in Patent Document 2 is a pixel circuit of the source follower circuit type with the drive transistor T1 being the n-channel TFT as in the pixel circuit shown in FIG. 13, and an additional transistor T5 which controls ON/OFF of the light emission current is provided in series with the drive transistor T1. However, also in this pixel circuit, the basic idea of compensating variations and a temporal change in characteristic of the drive transistor T1 is the same, and since the error E shown in Mathematical Formula 1 occurs with respect to compensation of variations in threshold voltage Vt1 of the drive transistor T1 as in the case of Patent Document 1, a large effect is exerted by the parasitic capacitances Cp, Cg that are parasitic on the source electrode and the gate electrode of the drive transistor T1 as in the pixel circuit shown in FIG. 13, and as the precision of pixels of the organic EL display device becomes higher, the compensation precision is to greatly deteriorate.

Here, since the parasitic capacitances Cp, Cg each have a constant value, as the capacitance element C1 becomes larger, the error E1 becomes larger, and the error E3 becomes smaller. By contrast, as the capacitance element C1 becomes smaller, the error E1 also becomes smaller, but the error E3 becomes larger. Therefore, for example, if the error E1 is made not to occur, when the capacitance element C1 is set to be large as compared with the parasitic capacitance Cg, the error E can be suppressed.

The present invention has been made in view of the above problem, and its object is to provide a pixel circuit that can stably and highly precisely hold a voltage between a gate electrode and a source electrode of an n-channel insulated gate thin-film transistor for controlling a light emission current, to make high-precision control of light emission, regardless of a magnitude of a parasitic capacitance of an internal node of the pixel circuit, and to provide a display device using the pixel circuit.

In order to achieve the above object, the present invention provides a pixel circuit with a first feature of being configured by including: a light emitting element which emits light by a light emission current flowing from an anode electrode to a cathode electrode; a first transistor element of an n-channel insulated gate thin-film transistor that has a source electrode connected with the anode electrode of the light emitting element, a gate electrode connected with a pixel node, and controls the light emission current in accordance with a light emission control voltage between the gate electrode and the source electrode; a first switch circuit which is interposed between a data signal line and the pixel node and is controlled for conduction/non-conduction in accordance with a voltage level of a first control terminal connected with a scan signal line; a second switch circuit which is interposed between the source electrode and a drain electrode of the first transistor element and is controlled for conduction/non-conduction in accordance with a voltage level of a second control terminal connected with the scan signal line, and comes into a conduction state at the time of conduction of the first switch circuit in accordance with a voltage level of the scan signal line, to selectively short-circuit between the source electrode and the drain electrode of the first transistor; and a capacitance element which is interposed between the gate electrode and the source electrode of the first transistor element, and holds the light emission control voltage.

Further, it is preferable that in the above pixel circuit with the first feature, the cathode electrode be connected with a reference voltage supply line and the drain electrode of the first transistor element be connected with a light emission voltage supply line, a level of a voltage that is supplied to the light emission voltage supply line be kept at a first voltage level which does not allow the light emitting element to emit light, with a voltage of the reference voltage supply line taken as a reference, in a transfer period in which the first switch circuit is brought into a conduction state in accordance with a voltage level of the scan signal line and a luminance voltage that is based on luminance of the light emitting element and supplied from the data signal line is transferred to the pixel node, and the level of the voltage that is supplied to the light emission voltage supply line be kept at a second voltage level which is sufficient for allowing the light emission current to flow in the light emitting element, with the voltage of the reference voltage supply line taken as a reference, in a light emission period in which the first switch circuit is brought into a non-conduction state in accordance with a voltage level of the scan signal line, the light emission control voltage is held in the capacitance element, the light emitting current based on the light emission control voltage is allowed to flow, and the light emitting element thereby emits light.

Further, the pixel circuit with the above first feature has a second feature that the first switch circuit is a second transistor element of an n-channel insulated gate thin-film transistor with a gate electrode being the first control terminal, a source electrode of the second transistor element is connected with the pixel node, and a drain electrode of the second transistor element is connected with the data signal line, and the second switch circuit is a third transistor element of an n-channel insulated gate thin-film transistor with a gate electrode being the second control terminal, a source electrode of the third transistor element is connected with the source electrode of the first transistor element, and a drain electrode of the third transistor element is connected with the drain electrode of the first transistor element.

Further, it is preferable that in the pixel circuit with the above first or second feature, the first transistor element be an oxide semiconductor transistor. Further, it is preferable that in the pixel circuit with the above second feature, at least the first transistor element and the second transistor element out of the first to third transistor elements be oxide semiconductor transistors.

Moreover, in order to achieve the above object, the present invention provides a display device with a first feature that a plurality of pixel circuits each configured by the pixel circuit with any one of the above features are arranged in a row direction and a column direction to constitute a pixel circuit array, the pixel circuits arranged on an identical column each have one end of the first switch circuit connected to the data signal line extending in the column direction along the identical column, and the pixel circuits arranged on an identical row each have the first control terminal of the first switch circuit and the second control terminal of the second switch circuit connected to the scan signal line extending in the row direction along the identical row, and the drain electrode of the first transistor element connected to a light emission voltage supply line extending in the row direction along the identical row, the display device including: a data signal line drive circuit which individually drives the data signal line provided in plural; a scan signal line drive circuit which individually drives the scan signal line provided in plural; and a light emission voltage supply line drive circuit which individually drives the light emission voltage supply line provided in plural.

Further, the display device with the above first feature has a second feature of including: a monitor circuit which has a dummy pixel circuit configured by removing at least the light emitting element from the pixel circuit, and detects a current flowing between the drain electrode and the source electrode of the first transistor element provided in the dummy pixel circuit, to perform simulation monitoring of a change in electric characteristic of the first transistor element in the pixel circuit; and a correction circuit which corrects a voltage level of the data signal line driven by the data signal line drive circuit based on a current amount detected by the monitor circuit or a value equivalent to the current amount.

Furthermore, the present invention provides a display device with a third feature that a plurality of pixel circuits are arranged in a row direction and a column direction to constitute a pixel circuit array, the pixel circuit is configured by at least including: a light emitting element which emits light by a light emission current flowing from an anode electrode to a cathode electrode; a first transistor element of an n-channel insulated gate thin-film transistor that has a source electrode connected with the anode electrode of the light emitting element, a gate electrode connected with a pixel node, and controls the light emission current in accordance with a light emission control voltage between the gate electrode and the source electrode; a first switch circuit which is interposed between a data signal line and the pixel node and is controlled for conduction/non-conduction in accordance with a voltage level of a first control terminal connected with a scan signal line; and a capacitance element which is interposed between the gate electrode of the first transistor element and the source electrode or a drain electrode of the first transistor element, the pixel circuits arranged on an identical column each have one end of the first switch circuit connected to the data signal line extending in the column direction along the identical column, and the pixel circuits arranged on an identical row each have the first control terminal of the first switch circuit connected to the scan signal line extending in the row direction along the identical row, and the drain electrode of the first transistor element connected directly or via another circuit element to a light emission voltage supply line extending in the row direction along the identical row, the display device including: a data signal line drive circuit which individually drives the data signal line provided in plural; a scan signal line drive circuit which individually drives the scan signal line provided in plural; a light emission voltage supply line drive circuit which individually drives the light emission voltage supply line provided in plural; a monitor circuit which has a dummy pixel circuit configured by removing at least the light emitting element from the pixel circuit, and detects a current flowing between the drain electrode and the source electrode of the first transistor element provided in the dummy pixel circuit, to perform simulation monitoring of a change in electric characteristic of the first transistor element in the pixel circuit; and a correction circuit which corrects a voltage level of the data signal line driven by the data signal line drive circuit based on a current amount detected by the monitor circuit or a value equivalent to the current amount.

Further, the display device with the above second or third feature has a fourth feature that the monitor circuit includes at least one dummy pixel circuit as mentioned above in which one end of the first switch circuit is connected to at least one data signal line as mentioned above, and the first control terminal of the first switch circuit in the dummy pixel circuit is connected to a dummy scan signal line.

Further, the display device with the above fourth feature has a fifth feature that the dummy scan signal line is driven every time each of the scan signal lines on a plurality of rows is sequentially driven by the scan signal line drive circuit in order to simultaneously bring the first switch circuits in the pixel circuits on an identical row into a conduction state.

Further, the display device with the above fourth or fifth feature has a sixth feature that the dummy pixel circuit is configured by removing at least the light emitting element from the pixel circuit and by including a third switch circuit which is interposed between a corresponding one of the data signal lines and the drain electrode of the first transistor element, the third switch circuit being controlled for conduction/non-conduction in accordance with a voltage level of a third control terminal connected with a monitor control signal line.

Further, the display device with any one of the above fourth to sixth features has a seventh feature that the monitor circuit includes the dummy pixel circuit, in which one end of the first switch circuit is connected to the data signal line, with respect to each of the data signal lines, and the first control terminal of the first switch circuit in each dummy pixel circuit is connected to the dummy scan signal line extending in the row direction.

Further, the display device with the above second or third feature has an eighth feature that the dummy pixel circuit is configured by removing at least the light emitting element and the first switch circuit from the pixel circuit, and the monitor circuit includes at least one dummy pixel circuit as mentioned above in which the gate electrode of the first transistor element is connected to at least one data signal line as mentioned above.

Further, the display device with the above eighth feature has a ninth feature that the monitor circuit includes the dummy pixel circuit, in which the gate electrode of the first transistor element is connected to the data signal line, with respect to each of the data signal lines.

Further, the display device with the above seventh or ninth feature has a tenth feature that the correction circuit individually corrects a voltage level of a corresponding one of the data signal lines driven by the data signal line drive circuit with respect to each of the data signal lines based on a current amount of a current outputted individually from the source electrode of the first transistor element in the dummy pixel circuit connected to the data signal line, or a value equivalent to the current amount.

Further, the display device with the above seventh or ninth feature has an eleventh feature that the correction circuit collectively corrects voltage levels of all of the data signal lines driven by the data signal line drive circuit based on a total or an average of current amounts of currents outputted respectively from the source electrodes of the first transistor elements in the dummy pixel circuits in the same number as the data signal lines, or a total or an average of values equivalent to the current amounts, or some other statistic value.

Further, the display device with any one of the above second to eleventh features has a twelfth feature that a current outputted from the source electrode of the first transistor element provided in the dummy pixel circuit is detected within a vertical blanking period.

Further, the display device with the above twelfth feature has a thirteenth feature that, within the vertical blanking period, in a dummy transfer period set to be a period before the monitor circuit detects a current outputted from the source electrode of the first transistor element in the dummy pixel circuit, the data signal line drive circuit supplies a reference luminance voltage for monitoring to the data signal line connected with one end of the first switch circuit in the dummy pixel circuit, the first switch circuit in the dummy pixel circuit is controlled in a conduction state, and the reference luminance voltage is transferred from the data signal line to the pixel node in the dummy pixel circuit.

According to the pixel circuit with the above features, by simple control of simultaneously bringing the first switch circuit and the second switch circuit into the conduction state or the non-conduction state and changing a voltage of the drain electrode of the first transistor element in synchronization with transition between the conduction state and the non-conduction state, in the transfer period when a current is being conducted through the first switch circuit and the second switch circuit, a voltage applied from the outside to between the gate electrode and the drain electrode of the first transistor element can be reliably held in the capacitance element regardless of a magnitude of a parasitic capacitance that is parasitic on the source electrode of the first transistor element, and since the voltage can be held in the capacitance element even after the first switch circuit and the second switch circuit are shifted to the non-conduction state and the light emission period is started, even when the current-voltage characteristic of the light emitting element changes, a light emission current in accordance with the luminance voltage read in the transfer period can be kept in a stable and high-precision manner. It is to be noted that the first transistor element and the first switch circuit in the pixel circuit with the above features respectively correspond to the drive transistor and the transfer transistor, respectively, in each of the conventional pixel circuits shown in FIGS. 13 and 15.

Also in the pixel circuit with the above features, similarly to each of the conventional pixel circuits shown in FIGS. 13 and 15, when a potential of the gate electrode increases via the capacitance element with increase in potential of the source electrode of the first transistor element after the start of the light emission period, a similar error to the error E3 shown in above Mathematical Formula 2 occurs, but differently from the conventional pixel circuits, the errors E1 and E2 shown in above Mathematical Formula 2 do not occur, and hence a capacitance of the capacitance element can be made sufficiently large with respect to the parasitic capacitance that is parasitic on the electrode of the first transistor element, so as to suppress a similar error to the error E3 to the minimum.

In the pixel circuit with the above features, the threshold voltage of the first transistor element is not compensated within the pixel circuit. Therefore, when variations and a temporal change in the threshold voltage are problematic, it is necessary to separately compensate the variations and the change. As opposed to this, since the variations and temporal change in the threshold voltage can be suppressed by adopting the oxide semiconductor transistor as the first transistor element, it becomes unnecessary to compensate the threshold voltage within the pixel circuit by means of a complex circuit configuration or complex timing control such as one where errors are superimposed. Further, a leak current of the transistor element is significantly suppressed by also configuring the second transistor element, which constitutes the first switch circuit, of the oxide semiconductor transistor, and it is thereby possible to further suppress the potential change of the gate electrode of the first transistor element.

On the other hand, according to the display device with the second to thirteenth features, the data signal line is driven at a voltage level corrected by the correction circuit in accordance with the temporal change in electric characteristic (threshold voltage, mobility, etc.) of the first transistor element by monitoring the changes in the monitor circuit, and a voltage between the gate electrode and the source electrode of the first transistor element is thereby corrected so as to cancel the change, thus allowing suppression of non-uniformity of the light emission luminance accompanying the change.

Here, according to the display device with the fifth feature, since the dummy scan signal line connected to the dummy pixel circuit within the monitor circuit is driven every time each of the normal scan signal lines within the pixel circuit array is sequentially driven, the potential of the gate electrode of the first transistor element in the dummy pixel circuit becomes the same potential as that of the gate electrode of the first transistor element within the pixel circuit corresponding to the scan signal line being driven within the pixel circuit array and changes every time the dummy scan signal line is driven, thereby becoming an average potential of the potentials of the gate electrode of the first transistor element in the pixel circuit within the pixel circuit array, and the dummy pixel circuit is applied with average stress with respect to stress which the pixel circuit within the pixel circuit array is applied with. Further, also in the display device with the seventh feature, in a similar manner, the dummy pixel circuit is applied with average stress with respect to stress which the pixel circuit within the pixel circuit array is applied with. Accordingly, monitoring the current of the first transistor element in the dummy pixel circuit within the monitor circuit allows monitoring of an average temporal change in electric characteristic (threshold voltage, mobility, etc.) of the first transistor element in the pixel circuit within the pixel circuit array.

Further, according to the display device with the sixth feature, a current flowing between the drain electrode and the source electrode of the first transistor element provided in the dummy pixel circuit can be supplied to the dummy pixel circuit from the data signal line connected to the dummy pixel circuit via the third switch circuit, and it can be detected on the data signal line, thereby eliminating the need for individually providing wiring for current detection.

DETAILED DESCRIPTION OF THE INVENTION

Each of embodiments of a pixel circuit and a display device of the present invention will be described below with reference to the drawings.

In a first embodiment, there will be described circuit configurations and operations of the display device of the present invention (hereinafter simply referred to as display device) and the pixel circuit of the present invention (hereinafter simply referred to as pixel circuit).

Figure 1:
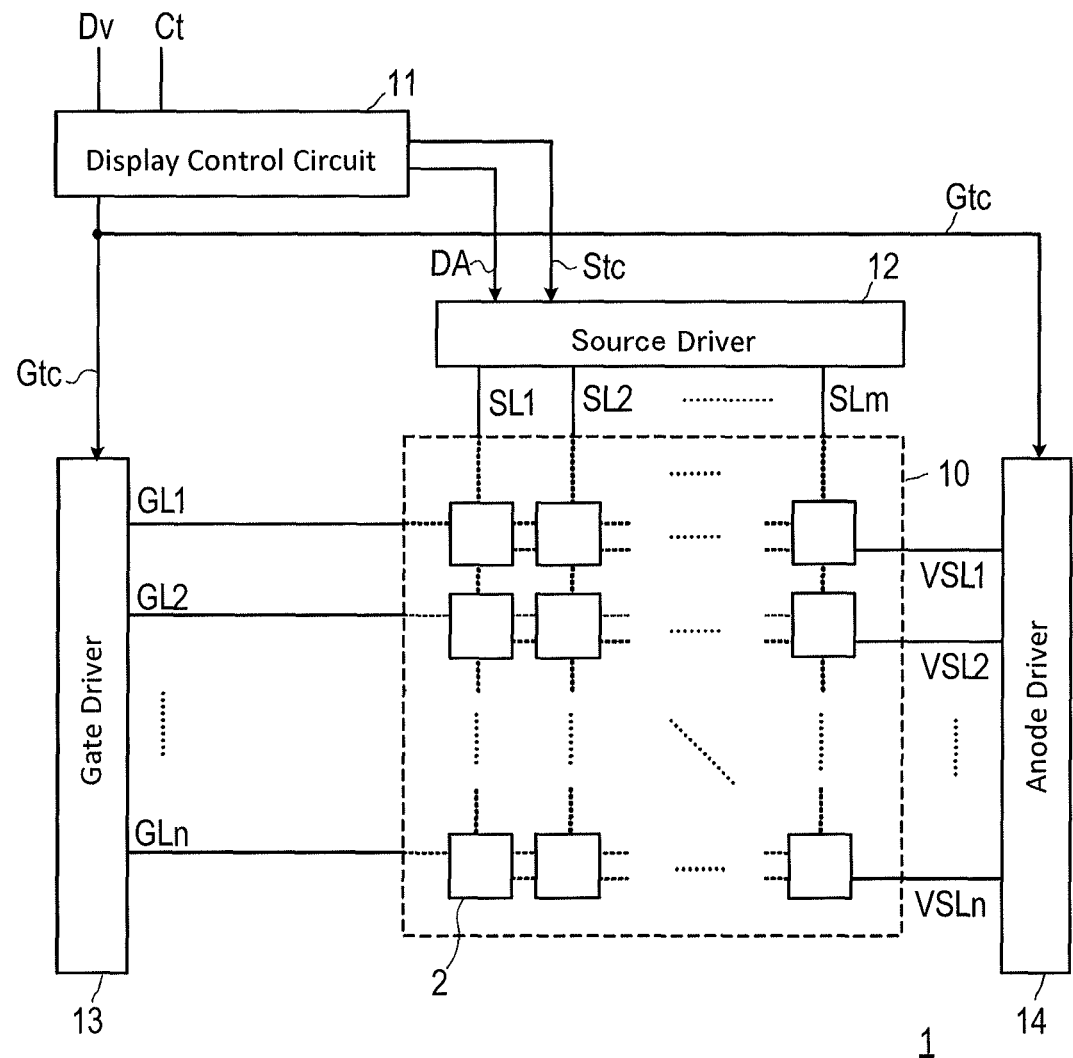
FIG. 1 is a block diagram showing a schematic configuration of one embodiment of a display device of the present invention.

FIG. 1 shows a schematic configuration of a display device 1. The display device 1 includes a pixel circuit array 10, a display control circuit 11, a source driver 12, a gate driver 13 and an anode driver 14. The pixel circuit array 10 is configured by arranging on an active matrix substrate a plurality of pixel circuits 2 in a row direction and a column direction. It is to be noted that in FIG. 1, the pixel circuits 2 are illustrated by blocks in order to avoid complexity of the drawing.

Figure 2:
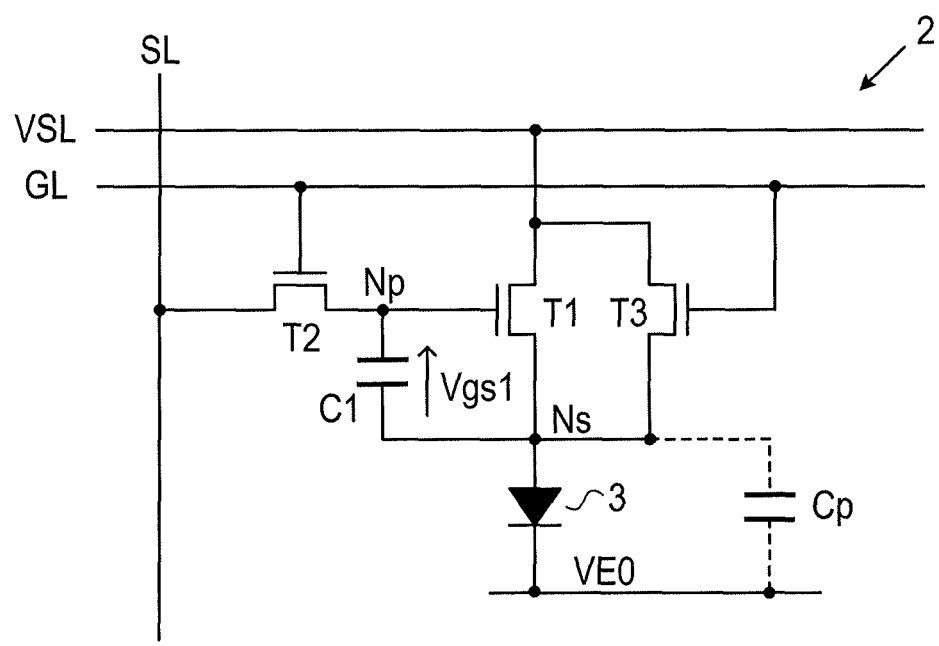
FIG. 2 is an equivalent circuit showing one embodiment of a pixel circuit of the present invention.

FIG. 2 shows an equivalent circuit diagram of the pixel circuit 2. As shown in FIG. 2, the pixel circuit 2 is configured including an organic EL element (OLED) 3, a drive transistor T1, a transfer transistor T2, a control transistor T3, and a capacitance element C1. Each of the above elements constituting each pixel circuit 2 is formed on the same active matrix substrate.

The drive transistor T1 is a transistor which controls a light emission current flowing in the OLED 3 in accordance with a light emission control voltage Vgs1 between a gate electrode and a source electrode, and has a drain electrode connected with a light emission voltage supply line VSL, a source electrode connected with an anode electrode of the OLED 3, and a gate electrode connected with a pixel node Np. The transfer transistor T2 is a switch element which transfers a luminance voltage Vs supplied from a source line SL to the pixel node Np in an ON state, and has a drain electrode connected with the source line SL, a source electrode connected with the pixel node Np, and a gate electrode connected with a gate line GL. The control transistor T3 is a switch element which comes into the ON state simultaneously with the transfer transistor T2 coming into the ON state, and short-circuits between the drain electrode and the source electrode of the drive transistor T1, and has a drain electrode connected with the drain electrode of the drive transistor T1, a source electrode connected with the source electrode of the drive transistor T1, and a gate electrode connected with the gate line GL. The capacitance element C1 is interposed between the gate electrode and the source electrode of the drive transistor T1. It should be noted that the luminance voltage Vs is an image input voltage to the pixel circuit 2, the voltage to be set in accordance with gradation of a display image in the pixel circuit 2, namely light emission luminance of the OLED 3. Further, in the following description, a contact point between the anode electrode of the OLED 3 and the source electrode of the drive transistor T1 is referred to as "reference node Ns" for the sake of convenience.

In the present embodiment, any of the drive transistor T1, the transfer transistor T2 and the control transistor T3 is an n-channel insulated gate thin-film transistor formed on the active matrix substrate (TFT substrate), and particularly formed of thin-film transistor of an oxide semiconductor such as InGaZnO. The drive transistor T1 corresponds to the "first transistor element", the transfer transistor T2 corresponds to the "first switch circuit (second transistor element)", and the control transistor T3 corresponds to the "second switch circuit (third transistor element)".

Figure 3:
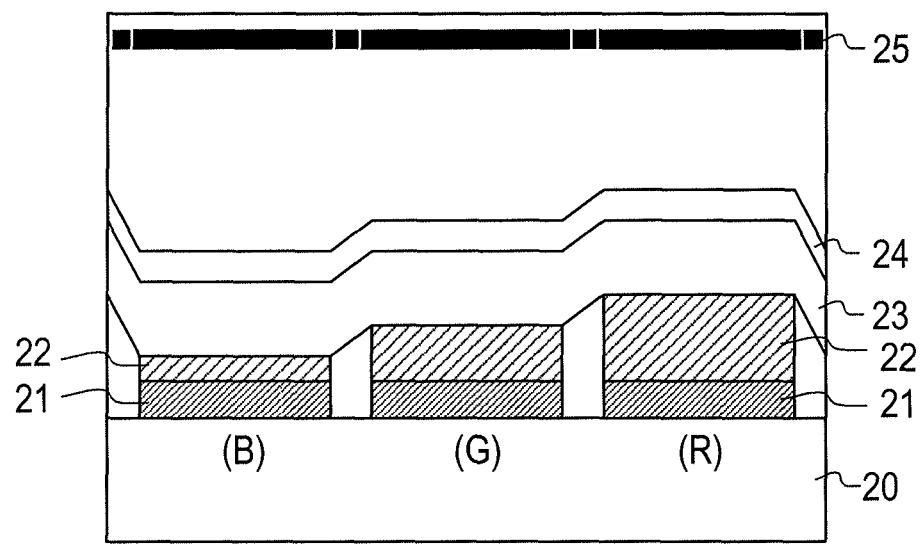
FIG. 3 is a main-part sectional view schematically showing one example of a laminate structure of an organic EL element used for the pixel circuit shown in FIG. 2.

FIG. 3 schematically shows a schematic laminate structure of the OLED 3 in each pixel circuit 2. FIG. 3 illustrates a case where three primary colors (R, G, B) are allocated to respective three adjacent pixel circuits 2 to make a full-color display. The OLED 3 in each pixel circuit 2 has a laminate structure formed by arranging a reflective metal layer 21, an ITO (indium tin oxide) anode electrode layer 22, an organic EL material layer 23 and a translucent cathode electrode layer 24 on an active matrix substrate 20 sequentially from the bottom, and a color filter 25 is arranged on an upper portion of the cathode electrode layer 24. The cathode electrode layers 24 are connected with one another among the adjacent pixel circuits 2, and integrated within the pixel circuit array 10. In the cathode electrode layer 24, a predetermined reference voltage VE0 (e.g., ground voltage) is supplied from the outside of the pixel circuit array 10 via a reference voltage supply line VRL. As shown in FIG. 3, a film thickness of the ITO anode electrode layer 22 varies among the three primary colors (R, G, B), and an optical path length from the front surface of the reflective metal layer 21 to the rear surface of the cathode electrode layer 24 is set in accordance with a wavelength of each color. Light to be emitted from the organic EL material layer 23 of each pixel circuit 2 is formed by synthesizing light that directly passes through the cathode electrode layer 24 and light that passes through the cathode electrode layer 24 after being reflected on the reflective metal layer 21, and the synthesized light passes through the color filter 25 and radiates upward in the drawing. In addition, the reflective metal layer 21 and the ITO anode electrode layer 22 are in ohmic-contact with each other and, though not shown, the reflective metal layer 21 is electrically connected with the source electrode of the drive transistor T1 formed on the same active matrix substrate 20.

As shown in FIG. 1, the pixel circuit array 10 is formed with m source lines SL (SL1, SL2, . . . , SLm) extending in the column direction, n gate lines GL (GL1, GL2, . . . , GLn) extending in the row direction, and n light emission voltage supply lines VSL (VSL1, VSL2, . . . , VSLn) extending in the row direction. In addition, a plurality of pixel circuits 2 are formed in a matrix form in places where the m source lines (SL1, SL2, . . . , SLm) extending in the column direction intersect with the n gate lines (GL1, GL2, . . . , GLn) extending in the row direction. It should be noted that m, n are natural numbers not smaller than 2. In addition, for the sake of convenience, the respective source lines (SL1, SL2, . . . , SLm) are collectively referred to as the source line SL, the respective gate lines (GL1, GL2, . . . , GLn) are collectively referred to as the gate line GL, and the respective light emission voltage supply lines (VSL1, VSL2, . . . , VSLn) are collectively referred to as the light emission voltage supply line VSL.

The display control circuit 11 is a circuit which controls an operation of writing the luminance voltage Vs in accordance with the display image into the pixel node Np of each pixel circuit 2 (write operation). During the write operation, the display control circuit 11 receives a data signal Dv indicating an image to be displayed and a timing signal Ct from an external signal source, and based on the signals Dv, Ct, the display control circuit 11 generates a digital image signal DA and a data-side timing control signal Stc to be given to a source driver 12 and a scan-side timing control signal Gtc to be given to the gate driver 13 and the anode driver 14, as signals for displaying an image in the pixel circuit array 10. In addition, it is also preferable to form part or the whole of the display control circuit 11 within the source driver 12 or the gate driver 13.

The source driver 12 is a circuit which applies a source signal with a predetermined voltage value and predetermined timing to each source line SL by control from the display control circuit 11. During the write operation, based on the digital image signal DA and the data-side timing control signal Stc, the source driver 12 generates a luminance voltage Vsij (i=1 to n, j=1 to m) on each column corresponding to a pixel value for one display line indicated by the digital image signal DA as each of the source signals Sc1, Sc2, . . . , Scm in each one horizontal period (also referred to as 1H period). The luminance voltages Vsij are multiple-gradation analog voltages (a plurality of voltages separated from one another), and a voltage range thereof is not lower than a minimum luminance voltage Vsmin and not higher than a maximum luminance voltage Vsmax. The source driver 12 then applies these source signals Scj (j=1 to m) to the corresponding source lines SL1, SL2, . . . , SLm.

The gate driver 13 is a circuit which applies a gate signal with a predetermined voltage amplitude and predetermined timing to each gate line GL by control from the display control circuit 11. Based on the scan-side timing control signal Gtc, in order to write the source signals Sc1, Sc2, . . . , Scm into respective pixel circuits 2, the gate driver 13 sequentially selects each of the gate signals GL1, GL2, . . . , GLn in almost each one horizontal period in each frame period of the digital image signal DA. It is to be noted that the gate driver 13 may be formed on the active matrix substrate 20, along with the pixel circuit 2.

The anode driver 14 is a circuit which applies a light emission power supply voltage with two different kinds of voltage levels to each light emission voltage supply line VSL at the same timing as the generation timing for a gate signal based on the scan-side timing control signal Gtc by control from the display control circuit 11. It is to be noted that the anode driver 14 may be formed on the active matrix substrate 20, along with the pixel circuit 2.

In addition, the source line SL corresponds to the "data signal line", and the gate line GL corresponds to the "scan signal line". The source driver 12 corresponds to the "data signal line drive circuit", the gate driver 13 corresponds to the "scan signal line drive circuit", and the anode driver 14 corresponds to the "light emission voltage supply line drive circuit".

Figure 4:
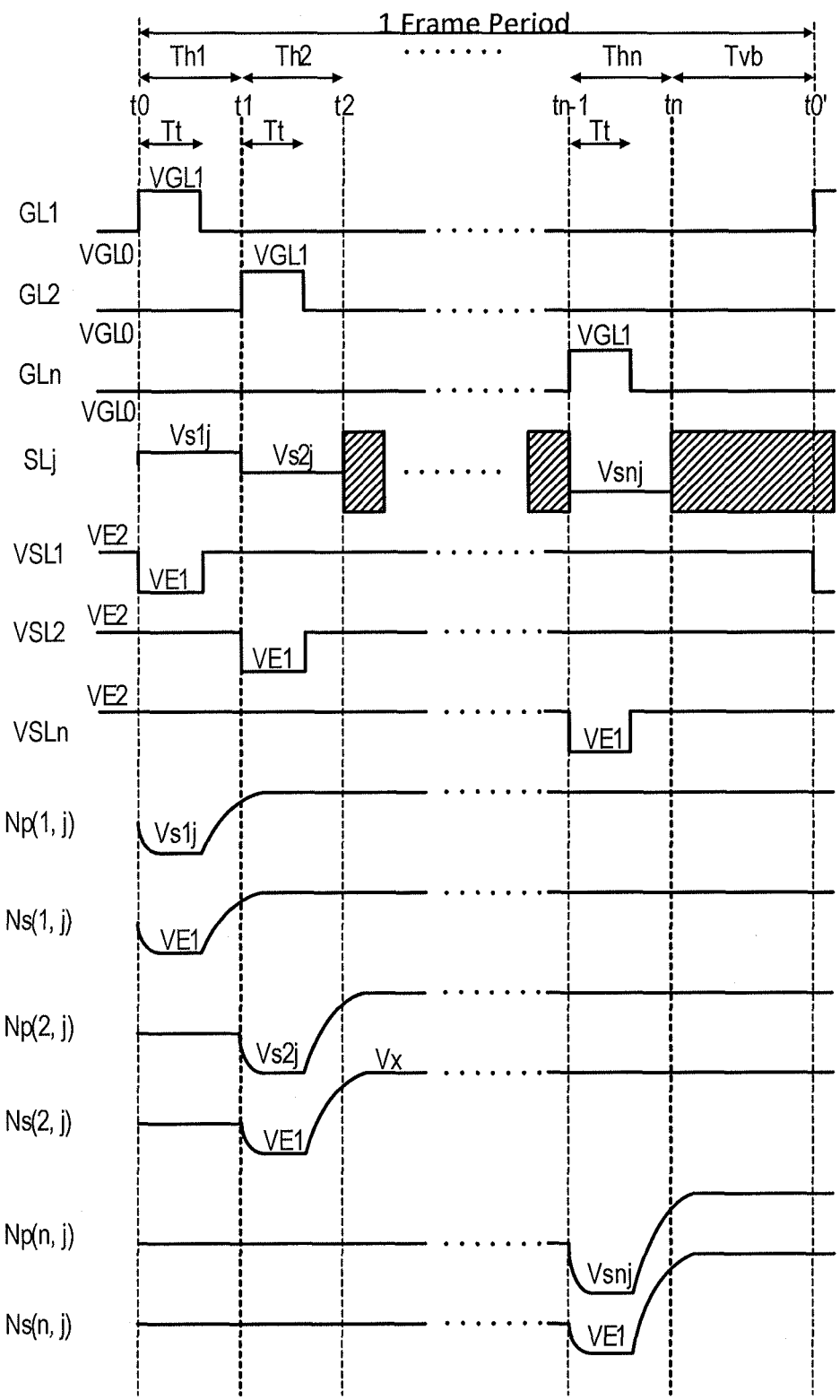
FIG. 4 is a timing diagram showing an operation procedure for a write operation on a pixel circuit array shown in FIG. 1.

Next, the write operation on the pixel circuit 2 will be described. FIG. 4 shows a voltage waveform of each of signal voltages of three gate lines GL1, GL2, GLn, a source line SLj and three light emission voltage supply lines VSL1, VSL2, VSLn, and a voltage waveform of a node voltage at each of pixel nodes Np (1, j), Np (2, j), Np (n, j) and each of reference nodes Ns (1, j), Ns (2, j), Ns (n, j) in three pixel circuits 2 (1, j), 2 (2, j), 2 (n, j) on the first row, the second row and the n-th row on an arbitrary column (j-th column) within the pixel circuit array 10 in the case of performing the write operation on the three pixel circuits 2 (1, j), 2 (2, j), 2 (n, j). Herein, j=1 to m.

A period from a time t0 to a time t0' is one frame period, and the one frame period is made up of n horizontal periods Th1 to Thn and a vertical blanking period Tvb. The write operation is performed on each pixel circuit 2 (1, j) in the horizontal period Th1 on the first row, the write operation is performed on each circuit 2 (2, j) in the horizontal period Th2 on the second row, and the write operation is performed on each pixel circuit 2 (n, j) in the horizontal period Thn on the n-th row. Since the write operation on each row is performed in completely the same manner, a description will be given taking the second row as an example.

At a time t1, a voltage level of a gate signal that is applied to the gate line GL2 shifts from a low voltage level VGL0 to a high voltage level VGL1, a voltage level of a light emission power supply voltage that is applied to the light emission voltage supply line VSL2 shifts from a second voltage level VE2 to a first voltage level VE1, and a voltage level of a source signal Scj that is applied to the source line SLj shifts from a luminance voltage Vs1j corresponding to a pixel value on the first row and the j-th column to a luminance voltage Vs2j corresponding to a pixel value on the second row and the j-th column. After the lapse of a predetermined transfer period Tt from the time t1 and before a time t2, the voltage level of the gate signal that is applied to the gate line GL2 returns from the high voltage level VGL1 to the low voltage level VGL0, and the voltage level of the light emission power supply voltage that is applied to the light emission voltage supply line VSL2 returns from the first voltage level VE1 to the second voltage level VE2. A period from an end time point for the transfer period Tt to a start time point for the transfer period Tt in the next frame is a light emission period.

With the voltage level of the source signal Scj being within the voltage range of the luminance voltage Vsij, the low voltage level VGL0 and the high voltage level VGL1 of the gate signal are sufficient voltage levels for bringing the transfer transistor T2 into the OFF state and ON state, respectively, and further, those are sufficient voltage levels for bringing the control transistor T3 into the OFF state and ON state, respectively. Accordingly, the transfer transistor T2 and the control transistor T3 are both in the ON state in the above transfer period Tt, and are each kept in the OFF state during the light emission period after the transfer period Tt. The first voltage level VE1 of the light emission power supply voltage is set such that, even when the voltage level is applied to the anode electrode of the OLED 3, a light emission current not smaller than a threshold current does not flow in the OLED 3 due to a voltage difference (VE1− VE0) from the reference voltage VE0 that is applied to the cathode electrode, and in the present embodiment, it is set to the same voltage as the reference voltage VE0 as one example. It is to be noted that the threshold current refers to a current to serve such that, when a light emission current not smaller than the threshold current flows in the OLED 3, the OLED 3 emits light with luminance in accordance with the magnitude of the light emission current.

In the transfer period Tt, the luminance voltage Vs2j is written into the pixel node Np in the pixel circuit 2 (2, j), and the first voltage level VE1 (=VE0) is written into the reference node Ns. A notable point here is that, since the voltage level of the reference node Ns is directly driven by the control transistor T3 in the ON state, it is precisely set to the first voltage level VE1 without being affected by the parasitic capacitance Cp that is parasitic on the reference node Ns. Similarly, since the voltage level of the pixel node Np is directly driven by the transfer transistor T2 in the ON state, it is precisely set to the luminance voltage Vs2j without being affected by the parasitic capacitance Cg that is parasitic on the pixel node Np. Hence at the end time point for the transfer period Tt, the light emission control voltage VGS1 (=Vs2j–VE1) is held at each end of the capacitance element C1.

After the lapse of the transfer period Tt, since the transfer transistor T2 and the control transistor T3 both come into the OFF state and the voltage level of the light emission power supply voltage returns from the first voltage level VE1 to the second voltage level VE2, the drive transistor T1 changes from the OFF state to the ON state. Even when the luminance voltage Vs2j is the maximum luminance voltage Vsmax, the voltage difference between the second voltage level VE2 and the reference voltage VE0 is set to a voltage not lower than a total of a voltage between the drain electrode and the source electrode sufficient for the drive transistor T1 to be operated in a saturation region and a voltage between the anode electrode and the cathode electrode of the OLED 3 in the case of the drain current during the saturation operation flowing in the OLED as the light emission current. Therefore, the drain current during the saturation operation in accordance with the light emission control voltage Vgs1 (=Vs2j–VE1) flows in the drive transistor T1 from the time immediately after the voltage level of the light emission power supply voltage returns to the second voltage level VE2, and hence, the voltage level of the reference node Ns increases due to the drain current to an operation point Vx which is set by means of the current-voltage characteristic of the OLED 3. When the voltage of the reference node Ns increases from the first voltage level VE1 to the operation point Vx, an amount (Vx–VE1) of the voltage change is transmitted to the pixel node Np via the capacitance element C1, and the voltage level of the pixel node Np also shifts to a value increased from the luminance voltage Vs2j just by the amount (Vx–VE1) of the voltage change.

Here, by the decrease in voltage level of the gate signal and the increase in voltage level of the light emission power supply voltage at a time point after the lapse of the transfer period Tt, a first voltage change due to a first parasitic capacitance between the gate electrode and the source electrode of the transfer transistor T2 and a second voltage change due to a second parasitic capacitance between the gate electrode and the drain electrode of the drive transistor T1 occur at the pixel node Np, and a third voltage change due to a third parasitic capacitance between the gate electrode and the source electrode of the control transistor T3 occurs at the reference node Ns. However, the first and second voltage changes can be ignored by sufficiently increasing the capacitance of the capacitance element C1 with respect to the first and second parasitic capacitances. Further, the third voltage change can be ignored by sufficiently increasing a total of the capacitance of the capacitance element C1 and the parasitic capacitance between the anode electrode and the cathode electrode of the OLED 3, with respect to the third parasitic capacitance. A notable point here is that, even when the capacitance of the capacitance element C1 is increased to cause an increase in ratio of the capacitance of the capacitance element C1 to the total capacitance at the reference node Ns, it does not have adverse effects on the change in voltage level of the reference node Ns. Accordingly, even after the increase in voltage of the reference node Ns to the operation point Vx, the light emission control voltage Vgs1 can be held at almost the same voltage as at the end time point for the transfer period Tt, thereby allowing the OLED 3 to be stably driven with the same light emission current throughout the light emission period.

With the light emission current set by the light emission control voltage Vgs1 of the drive transistor T1, even when there are variations in current-voltage characteristic of the OLED 3 between the pixel circuits 2 and the operation point Vx changes, the same light emission current flows in the OLED 3 if the light emission control voltage Vgs1 is the same, and hence a change in light emission luminance of the OLED 3 does not occur.

It should be noted that in the present embodiment, the threshold voltage of the drive transistor T1 is not included in the light emission control voltage Vgs1 held in the capacitance element C1 in the pixel circuit 2, and the variations and the temporal change in threshold voltage are not compensated, and hence there might occur variations in light emission current due to the above variations or the like. Accordingly, in the present embodiment, the thin-film transistor of oxide semiconductor with small variations in at least the threshold voltage of the drive transistor T1 is used.

In a second embodiment, a description will be given of a circuit configuration to perform compensation not within the individual pixel circuits 2 but outside the pixel circuit array 10 in a case where the transistor characteristic (threshold voltage, mobility, etc.) of the drive transistor T1 changes due to electric stress that is applied by repeatedly performing the above write operation.

Figure 5:
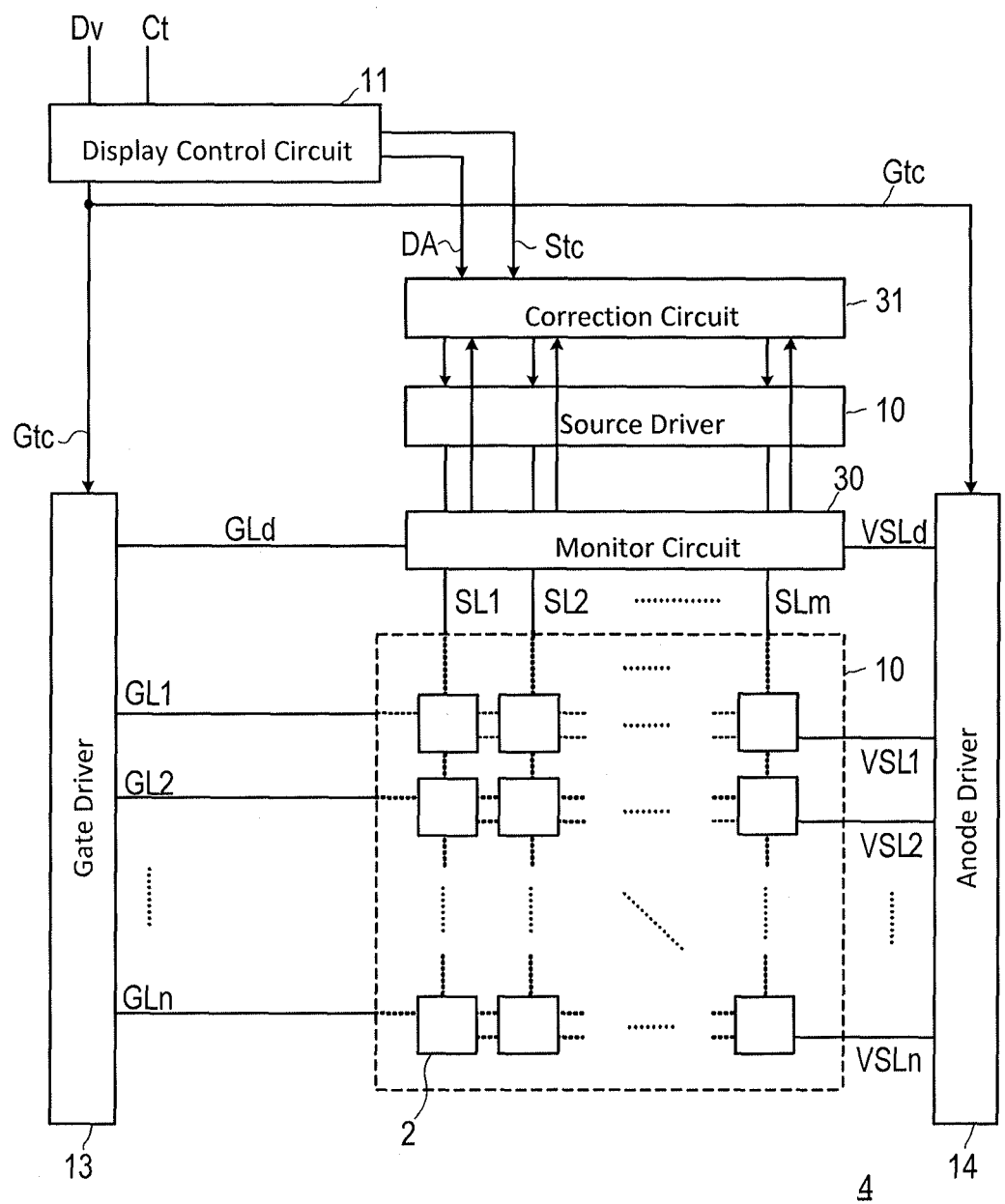
FIG. 5 is a block diagram showing a schematic configuration of another embodiment of the display device of the present invention.

FIG. 5 shows a schematic configuration of a display device 4 according to the second embodiment. The display device 4 is provided with a monitor circuit 30 and a correction circuit 31 on top of the pixel circuit array 10, the display control circuit 11, the source driver 12, the gate driver 13 and the anode driver 14. The pixel circuit array 10, the display control circuit 11, the source driver 12, the gate driver 13, the anode driver 14, and the pixel circuits 2 constituting the pixel circuit array 10 have the same circuit configuration as that of the display device 1 described in the first embodiment, with control during the write operation being also the same, and an overlapping description is thus omitted.

Figure 6:
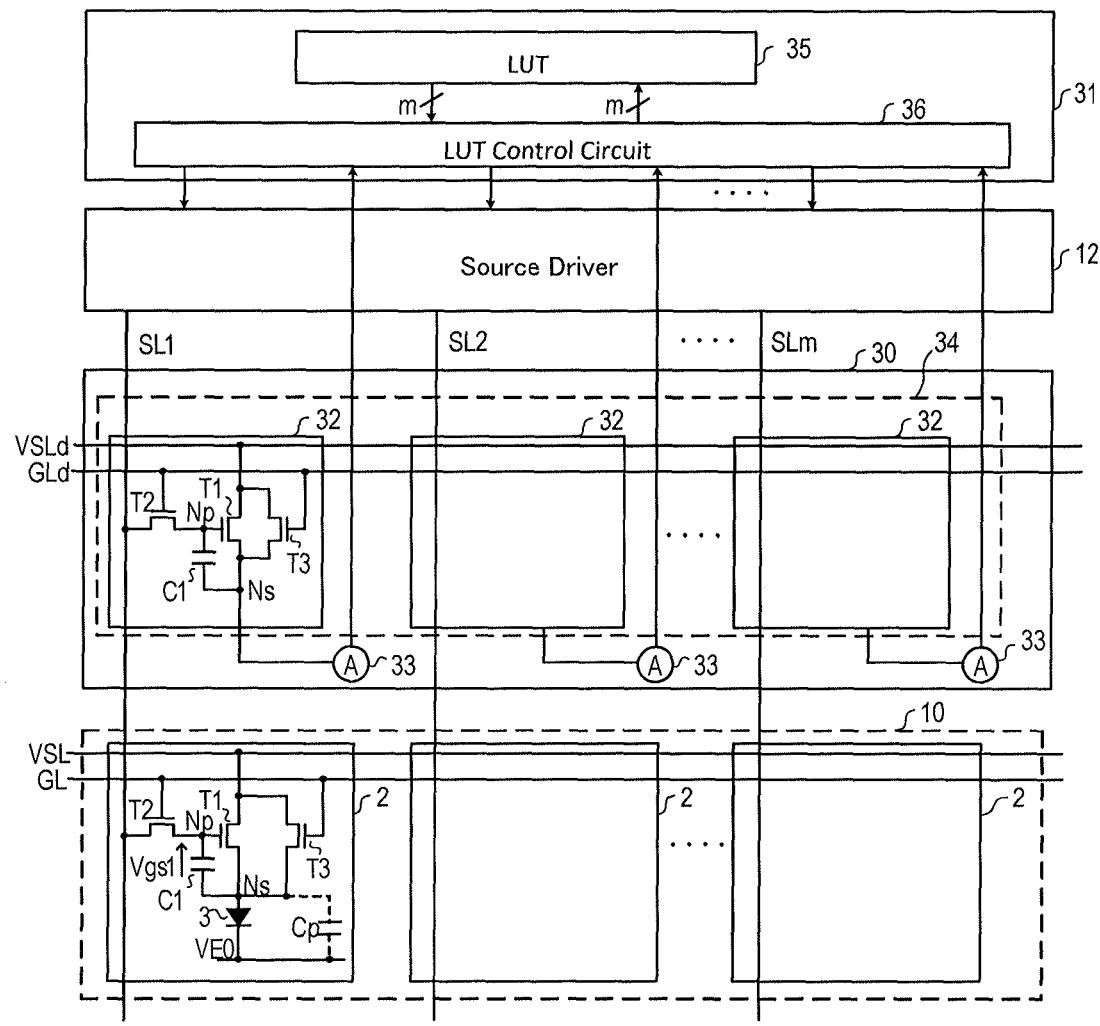
FIG. 6 is a circuit block diagram showing a schematic configuration of a monitor circuit and a correction circuit used in the display device shown in FIG. 5.

FIG. 6 shows a schematic configuration of the monitor circuit 30 and the correction circuit 31. The monitor circuit 30 is configured including m dummy pixel circuits 32 and m ammeters 33, the number of which is the same as the number of m columns of the pixel circuit array 10. In the present embodiment, the dummy pixel circuit 32 has a circuit configuration formed by removing the OLED 3 from the pixel circuit 2 shown in FIG. 2, and is configured including the drive transistor T1, the transfer transistor T2, the control transistor T3 and the capacitance element C1. The source electrode of the drive transistor T1 is connected with the ammeter 33 in place of the OLED 3. A dummy pixel circuit array 34 of one row and m columns is formed of the m dummy pixel circuits 32, and arranged adjacent to the pixel circuit array 10. The drain electrode of the transfer transistor T2 in the dummy pixel circuit 32 on the j-th column within the dummy pixel circuit array 34 is connected with the source line SLj on the corresponding j-th column. Further, the gate electrode of the transfer transistor T2 is connected to a dummy gate line GLd, and the drain electrode of the drive transistor T1 is connected with a dummy light emission voltage supply line VSLd, in each dummy pixel circuit 32. The present embodiment has a configuration where the dummy gate line GLd is driven by the gate driver 13 and the dummy light emission voltage supply line VSLd is driven by the anode driver 14, but it may have a configuration where at least either one of them is directly controlled from the display control circuit 11.

The correction circuit 31 is configured including: a look up table (LUT) 35 which is stored with a detected value of the ammeter 33 associated with a correction amount ΔVadj with respect to the luminance voltage Vsij that is applied to the source line SLj; and a LUT control circuit 36 which sequentially gets access to the LUT 35 with respect to each of the detected values for the m columns, to read the correction amount ΔVadj on each of the corresponding columns, and outputs it to the source driver 12. In the present embodiment, the source driver 12 receives the correction amount ΔVadj on each column from the LUT control circuit 36, and based on the correction amount ΔVadj, the source driver 12 adds the same correction amount ΔVadj to the luminance voltage Vsij, which is applied to the source line SLj on the corresponding column (j-th column), with respect to each of all the rows.

A drain current Id1 during the saturation operation of the drive transistor T1 is proportional to a square of a difference between the threshold voltage Vt1 and the light emission control voltage Vgs1 between the gate electrode and the source electrode as shown in Mathematical Formula 4 below, and hence a square root of the drain current Id1 and the light emission control voltage Vgs1 have a linear relation. It is to be noted that β in Mathematical Formula 4 is a transconductance of the drive transistor T1.

$$Id1=\beta \times (Vgs1-Vt1)^2/2$$

$$Id1^{1/2}=(\beta/2)^{1/2}\times(Vgs1-Vt1) \qquad \text{(Mathematical Formula 4)}$$

Figure 7:
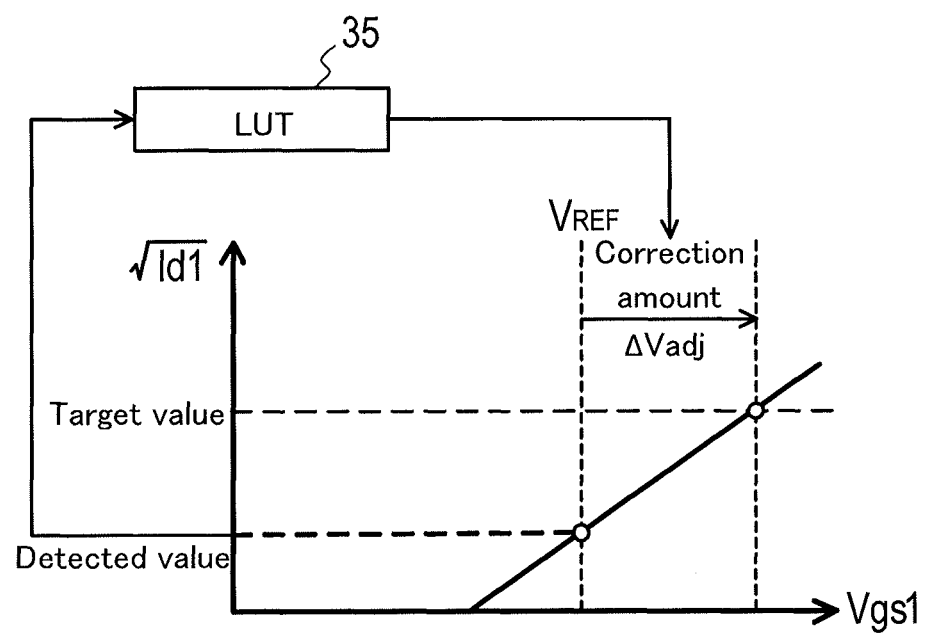
FIG. 7 is a diagram schematically showing a principle of correction processing and its processing sequence executed in the correction circuit shown in FIG. 6.

Therefore, the correction amount with respect to the light emission control voltage Vgs1 can be found by calculating an error between the square root of the drain current Id1 and its target value from the detected value of the ammeter 33. The LUT 35 is one previously stored with the relation between the error from the target value of the square root of the drain current Id1 and the correction amount, based on the linear relation. FIG. 7 schematically shows a principle of the above correction processing and its processing sequence.

Figure 8:
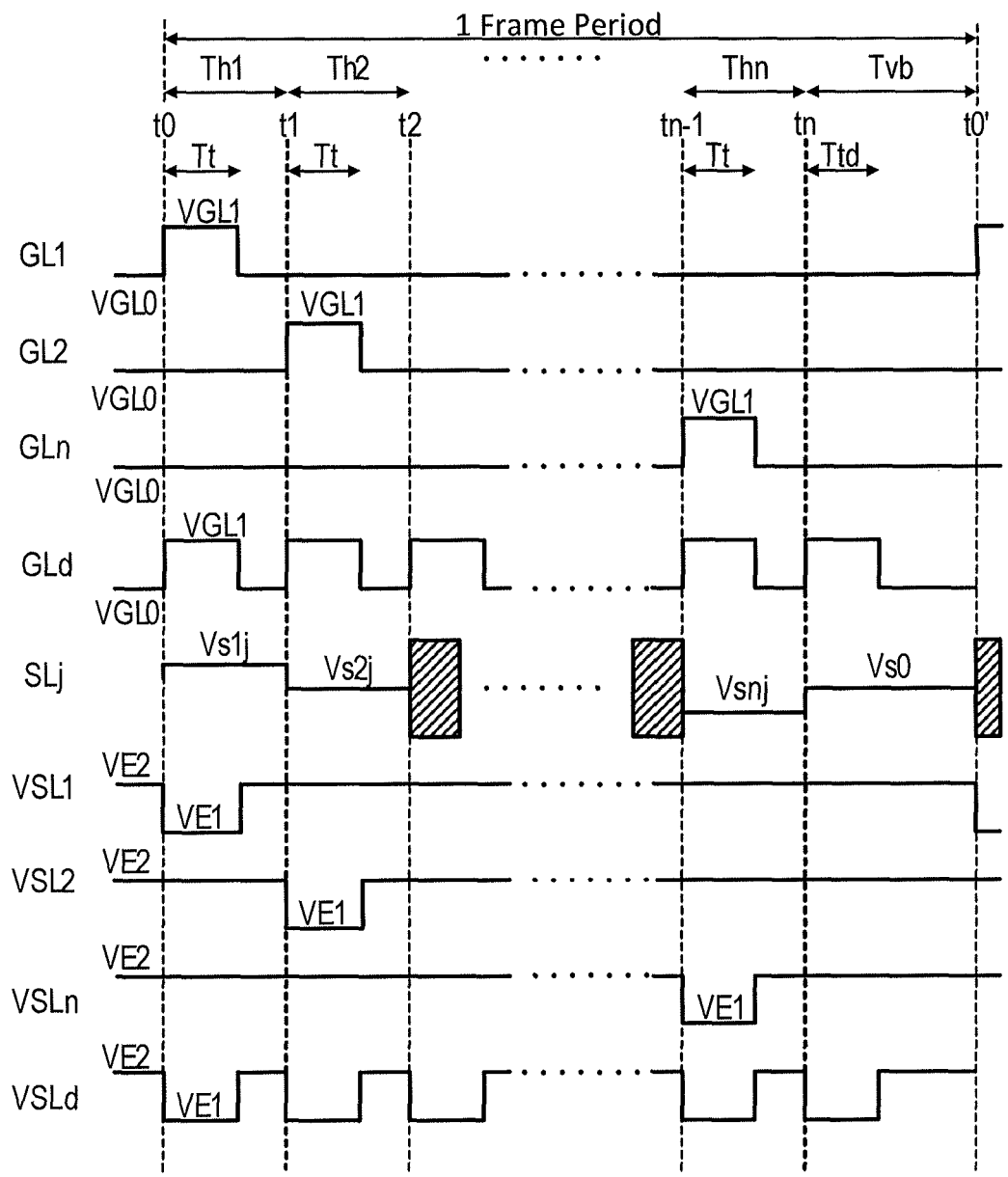
FIG. 8 is a timing diagram showing operation sequences for a write operation on a dummy pixel circuit array shown in FIG. 6, and for operations of the monitor circuit and the correction circuit.

Next, a description will be given of the write operation on the dummy pixel circuit 32 and operations on the monitor circuit 30 and the correction circuit 31. FIG. 8 shows a voltage waveform of each of signal voltages of the three gate lines GL1, GL2, GLn, the source line SLj, the three light emission voltage supply lines VSL1, VSL2, VSLn, the dummy gate line GLd and the dummy light emission voltage supply line VSLd in the case of performing the write operation on a dummy pixel circuit 32j on the same column (j-th column) as three pixel circuits 2 (1, j), 2 (2, j), 2 (n, j) on the first row, the second row and the n-th row on an arbitrary column (j-th column) within the pixel circuit array 10.

During each transfer period Tt in each of all the horizontal periods Th1 to Thn, the dummy gate line GLd is kept at the high voltage level VGL1, the transfer transistor T2 in the dummy pixel circuit 32 comes into the ON state, and the luminance voltage Vsij that is applied to the source line SLj is applied to the pixel node Np in each horizontal period Thi. In periods other than each transfer period Tt in all the horizontal periods Th1 to Thn, the transfer transistor T2 and the control transistor T3 in the dummy pixel circuit 32 come into the OFF state, and the light emission current in accordance with the light emission control voltage Vgs1 flows in the drive transistor T1. However, in each horizontal period Thi, the light emission current is not detected by the ammeter 33. As far as one horizontal period Thi is concerned, an operation from the outside on the dummy pixel circuit 32 is the same as the operation from the outside on the selected pixel circuit 2.

In the vertical blanking period Tvb after the end of the final horizontal period Thn, a dummy transfer period Ttd is provided, and in the dummy transfer period Ttd, the dummy gate line GLd shifts to the high voltage level VGL1, the transfer transistor T2 and the control transistor T3 in the dummy pixel circuit 32 come into the ON state, and the reference luminance voltage Vs0 that is applied to the source line SLj in the dummy transfer period Ttd is applied to the pixel node Np. The reference luminance voltage Vs0 is set to a predetermined value within a voltage range of the luminance voltage Vsij (e.g., a center value, the maximum luminance voltage Vsmax, etc. of the voltage range).

At the end time point for the dummy transfer period Ttd, the transfer transistor T2 and the control transistor T3 in the dummy pixel circuit 32 come into the OFF state, and a dummy light emission current in accordance with a reference light emission control voltage V0gs1 (=Vs0j−VE1) flows in the drive transistor T1. Each of the m ammeters 33 in the monitor circuit 30 separately detects each corresponding dummy light emission current by each source line SLj after the dummy transfer period Ttd within the vertical blanking period Tvb.

Subsequently, the LUT control circuit 36 in the correction circuit 31 reads the correction amount ΔVadj from the LUT 35 on each column based on each of the dummy light emission currents detected for the m columns, and outputs it to the source driver 12. When a new frame period is started, in each of the following horizontal periods Thi, the source driver 12 adds the same correction amount ΔVadj to the luminance voltage Vsij, which is applied to the source line SLj on the corresponding column (j-th column), with respect to each of all the rows based on the updated correction amount ΔVadj.

In the timing diagram illustrated in FIG. 8, the case is assumed where detection of the dummy light emission current and extraction and updating of the correction amount ΔVadj (these are collectively referred to as "external compensation operation") are performed in the vertical blanking period Tvb in every frame period, but the external compensation operation is not necessarily required to be executed every time in each frame period. For example, in the case of executing the external compensation operation in every k frames (k is an integer not smaller than 2), in the first frame period after the external compensation operation has been performed, the transfer transistor T2 and the control transistor T3 in the dummy pixel circuit 32 are brought into the ON state only in the transfer period Tt in a horizontal period Thi (mod (i, k)=0) when a row on which a reminder mod (i, k) obtained by dividing the number i of rows by a value k is 0 is selected, while the transfer transistor T2 and the control transistor T3 in the dummy pixel circuit 32 are brought into the OFF state in a horizontal period Thi (mod (i,k)≠0) other than the above, and in the second to k-th frame periods after the external compensation operation has been performed, the remainder is increased one by one in each frame period, and the transfer transistor T2 and the control transistor T3 in the dummy pixel circuit 32 are brought into the ON state only in the transfer period Tt in a horizontal period Thi (mod (i,k)=k'−1) when a reminder mod (i, k) obtained by dividing the number i of rows by a value k is k'−1 in a k'-th frame period, while the transfer transistor T2 and the control transistor T3 in the dummy pixel circuit 32 are brought into the OFF state in a horizontal period Thi (mod (i,k)≠k'−1) other than the above. In addition, the above external compensation operation may be performed in the vertical blanking period Tvb after the final horizontal period Thn of the k-th frame period.

Other embodiments will be described below.

<1> In each of the above embodiments, any of the three thin-film transistors T1 to T3 constituting the pixel circuit 2 and the dummy pixel circuit 32 have been assumed to be formed of the n-channel oxide semiconductor thin-film transistor, and particularly, InGaZnO has been assumed as an oxide semiconductor. However, conductive types of the thin-film transistors T2, T3 are not necessarily restricted to the n-channel type. The thin-film transistors T2, T3 may be p-channel types. Further, in the above embodiment, the use of transistor with small variations in transistor characteristic as the drive transistor T1 has been assumed, but the transistor with small variations in transistor characteristic is not necessarily restricted to the oxide semiconductor thin-film transistor.

<2> In each of the above embodiments, the use of the organic EL element (OLED) as the light emitting element provided within the pixel circuit 2 has been assumed, but the light emitting element is not restricted to the organic EL element so long as it is a light emitting element whose light emission luminance is controlled by control of the light emission current flowing from the anode electrode to the cathode electrode of the light emitting element by means of the drive transistor T1. Further, that the light emitting element has rectification is not a requisite condition.

<3> The dummy pixel circuit 32 used in the display device 4 of the above second embodiment is not necessarily restricted to the circuit configuration formed by removing only the OLED 3 from the pixel circuit 2 shown in FIG. 2, as shown in FIG. 6. For example, as shown in FIG. 9, it may be a circuit configuration formed by removing the OLED 3 and the control transistor T3 from the pixel circuit 2 shown in FIG. 2, or as in FIG. 10, a circuit configuration formed by removing the OLED 3, the transfer transistor T2 and the control transistor T3 from the pixel circuit 2 shown in FIG. 2.

Figure 9:
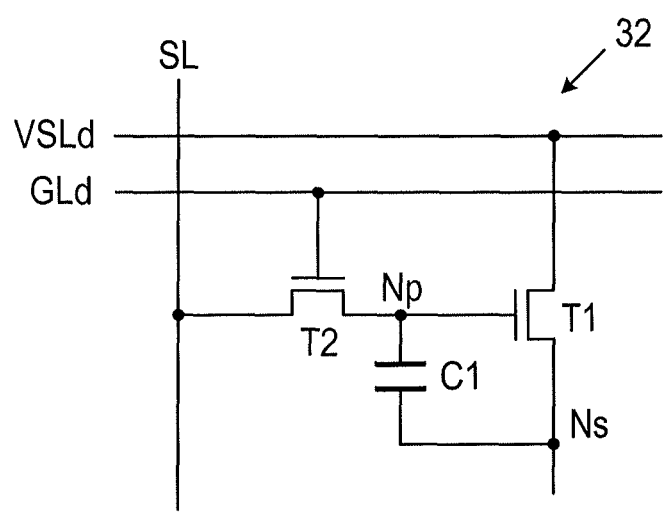
FIG. 9 is an equivalent circuit showing another embodiment of a circuit configuration for a dummy pixel circuit constituting the monitor circuit shown in FIG. 6.

When the dummy pixel circuit 32 has the circuit configuration shown in FIG. 9, during the transfer period Tt when the transfer transistor T2 in the dummy pixel circuit 32 is in the ON state, the source electrode of the drive transistor T1 may be driven from each ammeter 33 side so as to have the reference voltage VE0. In this case, the second voltage level VE2 may be constantly applied to the dummy light emission voltage supply line VSLd, or alternatively the first voltage level VE1 (=VE0) may be applied during the transfer period Tt and the second voltage level VE2 may be applied in the period other than the transfer period Tt.

Figure 10:
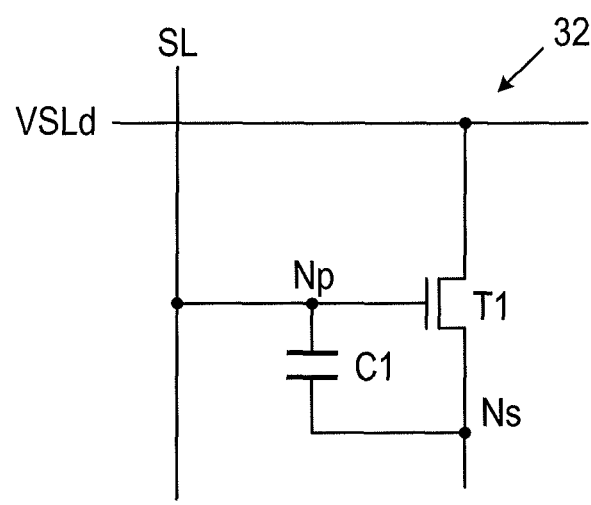
FIG. 10 is an equivalent circuit showing still another embodiment of a circuit configuration for the dummy pixel circuit constituting the monitor circuit shown in FIG. 6.

Further, when the dummy pixel circuit 32 has the circuit configuration shown in FIG. 10, the gate electrode of the drive transistor T1 in the dummy pixel circuit 32 on the j-th column may be directly connected to the corresponding source line SLj, and the source electrode of the drive transistor T1 may be driven from each ammeter 33 side so as to have the reference voltage VE0. In this case, the second voltage level VE2 may be constantly applied to the dummy light emission voltage supply line VSLd, or alternatively the first voltage level VE1 (=VE0) may be applied during the transfer period Tt and the second voltage level VE2 may be applied in the period other than the transfer period Tt.

Figure 11:
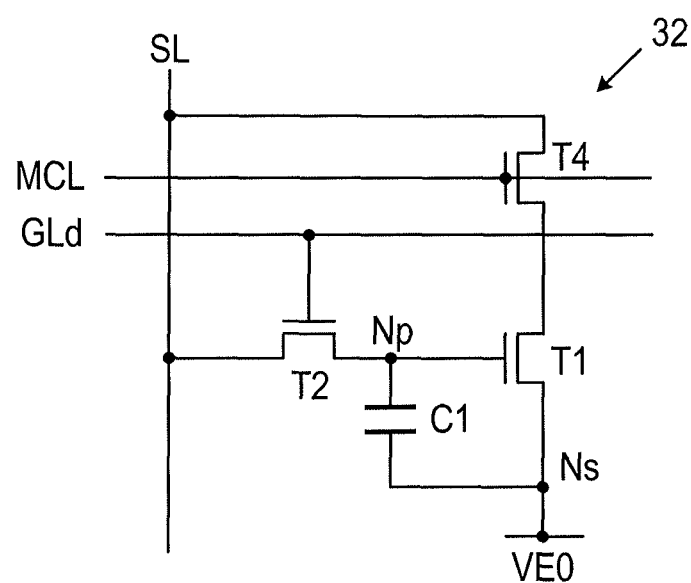
FIG. 11 is an equivalent circuit showing still another embodiment of the circuit configuration for the dummy pixel circuit.

<4> Further, in place of the circuit configuration shown in FIG. 6, the dummy pixel circuit 32 used in the display device 4 of the above second embodiment may have a circuit configuration formed by removing at least the OLED 3 out of the OLED 3, the control transistor T3 and the capacitance element C1 from the pixel circuit 2 shown in FIG. 2, and providing a third switch circuit which is interposed between the drain electrode of the first transistor T1 and the source line SL connected with the drain electrode of the transfer transistor T2 in the same dummy pixel circuit 32, and is controlled for conduction/non-conduction in accordance with a voltage level of a third control terminal connected with a monitor control signal line MCL. Specifically, the dummy pixel circuit 32 is configured including, for example as shown in FIG. 11, the drive transistor T1, the transfer transistor T2, a monitor control transistor T4 as the third switch circuit, and the capacitance element C1. In place of being connected with the OLED 3, the source electrode of the drive transistor T1 is provided with the reference voltage VE0 (e.g., ground voltage) which is supplied to the pixel circuit array 10 via the reference voltage supply line VRL. Similarly to the other transistors T1 to T3, the monitor control transistor T4 is formed of the n-channel insulated gate thin-film transistor, and has a drain electrode connected with the source line SL, a gate electrode connected with the monitor control signal line MCL, and a source electrode connected with the drain electrode of the drive transistor T1. It is to be noted that the capacitance element C1 may be substituted for a capacitance that is parasitic on the gate electrode of the drive transistor T1.

Figure 12:
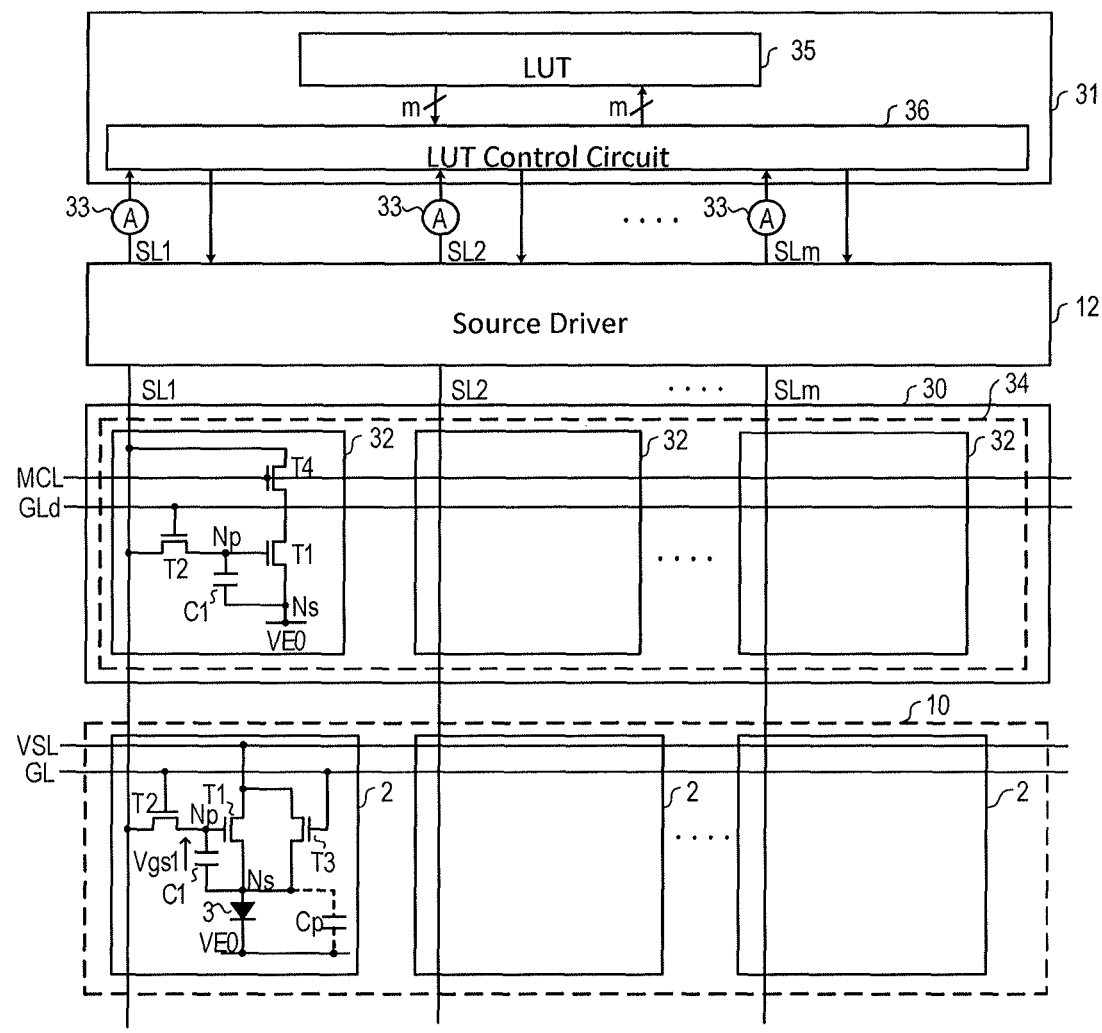
FIG. 12 is a circuit block diagram showing a schematic configuration of a monitor circuit and a correction circuit using the dummy pixel circuit shown in FIG. 11.

In the case of constituting the monitor circuit 30 by use of m dummy pixel circuits 32 shown in FIG. 11, as shown in FIG. 12, a dummy pixel circuit array 34 of one row and m columns is formed of the m dummy pixel circuits 32, and arranged adjacent to the pixel circuit array 10. The drain electrode of the monitor control transistor T4 in the dummy pixel circuit 32 on the j-th column within the dummy pixel circuit array 34 is connected with the source line SLj on the corresponding j-th column. Further, the gate electrode of the transfer transistor T2 is connected to the dummy gate line GLd, and the gate electrode of the monitor control transistor T4 is connected to the monitor control signal line MCL, in each dummy pixel circuit 32. The present embodiment has a configuration where the dummy gate line GLd is driven by the gate driver 13 and the monitor control signal line MCL is driven by the anode driver 14, but it may have a configuration where at least either one is directly controlled by the display control circuit 11.

Driving of the dummy gate line GLd in each of the horizontal periods Th1 to Thn and the vertical blanking period Tvb is the same as in the case of the second embodiment shown in FIG. 8. Further, driving of each source line SLj in each of the horizontal periods Th1 to Thn and the dummy transfer period Ttd in the vertical blanking period Tvb is the same as in the case of the second embodiment shown in FIG. 8. The voltage level of the monitor control signal line MCL has the opposite phase to the voltage level of the dummy gate line GLd, and it is controlled such that the monitor control transistor T4 is in the ON state when the transfer transistor T2 is in the OFF state, and the monitor control transistor T4 is in the OFF state when the transfer transistor T2 is in the ON state. In order to detect a current flowing in the drive transistor T1 with the ammeter 33 connected to the source line SLj after the dummy transfer period Ttd in the vertical blanking period Tvb, the voltage level of the source line SLj is controlled such that the drive transistor T1 is operated in the saturation region.

<5> The above second embodiment has the configuration where the LUT control circuit 36 in the correction circuit 31 receives each of detected values for m columns from the m ammeters 33, sequentially gets access to the LUT 35 to read the correction amount ΔVadj on each of the columns corresponding to the detected value, and outputs it to the source driver 12, and the source driver 12 performs correction processing of adding the same correction amount ΔVadj to the luminance voltage Vsij, which is applied to the source line SLj on the corresponding column (j-th column), with respect to each of all the rows based on the correction amount ΔVadj on each of the columns, namely the processing is correction processing (correction processing by column) which is independent with respect to each column, but same correction processing (batch correction processing) may be performed on each of all the columns or a column group of a plurality of columns. The same applies to the above other embodiments <3> and <4>. Specifically, in the case of performing the batch correction processing on each of all the columns, the LUT control circuit 36 receives each of detected values for m columns from the m ammeters 33, calculates, for example, an average value (this may another statistic value such as a center value, the maximum value, the minimum value, or a total) of these detected values, gets access to the LUT 35 to read one correction amount ΔVad with respect to the average value, and outputs it to the source driver 12, and the source driver 12 performs correction processing of adding the same correction amount ΔVad to the luminance voltage Vsij, which is applied to each of all the source lines SLj, with respect to each of all the rows based on the one correction amount ΔVad. In the case of performing the batch correction processing in a column group unit, the pixel circuit array 10 is divided into a plurality of sub-arrays in the row direction (the number of rows is n, the same as that of the pixel circuit array 10), an average value of the correction amounts ΔVadj on the respective columns is calculated in a sub-array unit, the LUT 35 is accessed and the correction amount ΔVad is read therefrom with respect to each of the average values in the same number as that of the sub-arrays, and outputted to the source driver 12, and with respect to each sub-array, based on the correction amounts ΔVad in the same number as that of the sub-arrays, the source driver 12 performs correction processing of adding the same correction amount ΔVad to the luminance voltage Vsij, which is applied to the corresponding source line SLj, on each of all the rows within the same sub-array.

<6> Further, in the above second embodiment, it has been assumed that, in the case of performing the external compensation operation in each one frame period, control is made so as to keep the dummy gate line GLd at the high voltage level VGL1 and bring the transfer transistor T2 in the dummy pixel circuit 32 into the ON state during each of the transfer periods Tt in each of all the horizontal periods Th1 to Thn, but there may be employed a configuration where, for example, two dummy gate lines GLd are provided, the dummy pixel circuit 32 on an even-number column is connected with one dummy gate line GLde, the dummy pixel circuit 32 on an odd-number column is connected with the other dummy gate line GLdo, control is made so as to keep the one dummy gate line GLde at the high voltage level VGL1 and bring the transfer transistor T2 in the dummy pixel circuit 32 on the even-number column into the ON state only in the transfer period Tt in the horizontal period Thi (i=even-number) for the even-number row, and control is made so as to keep the other dummy gate line GLdo at the high voltage level VGL1 and bring the transfer transistor T2 in the dummy pixel circuit 32 on the odd-number column into the ON state only in the transfer period Tt in the horizontal period Thi (i=odd-number) for the odd-number row. The same applies to the above other embodiment <3> (though excluding the case of the dummy pixel circuit 32 shown in FIG. 10) and the above other embodiment <4>. Further, the number of dummy gate lines GLd may not be made two but made three or more, to increase the number of groups of the dummy pixel circuits 32, the group within which the transfer transistors T2 simultaneously come into the ON state, to three or more.

<7> Further, in the above second embodiment, there has been described the case where the dummy pixel circuit 32 is provided on each of all the source lines SL, but the dummy pixel circuit 32 may be provided only on the source line SL which is part (e.g., one) of the m source lines SL. The same applies to the above other embodiments <3> and <4>.

<8> Further, in the above second embodiment, there has been described the case where one dummy pixel circuit array 34 is provided with respect to one pixel circuit array 10, but for example, the pixel circuit array 10 may be divided into two sections in the column direction, one dummy pixel circuit array 34 may be provided with respect to one-side half and arranged adjacent to an end of the one-side half of the pixel circuit array 10, and one dummy pixel circuit array 34 may be provided with respect to the other-side half and arranged adjacent to an end of the other-side half of the pixel circuit array 10. Then, the correction processing may be performed on the one-side half of the pixel circuit array 10 based on a dummy light emission current detected from the one-side dummy pixel circuit array 34, and the correction processing may be performed on the other-side half of the pixel circuit array 10 based on a dummy light emission current detected from the other-side dummy pixel circuit array 34. Further, the correction processing may be performed on the whole pixel circuit array 10 based on the dummy light emission currents detected from both the one-side and other-side dummy pixel circuit arrays 34. The same applies to the above other embodiments <3> and <4>.

<9> Further, in the above second embodiment, the dummy pixel circuit array 34 has been configured by providing one dummy pixel circuit 32 with respect to one source line SL, but two or more dummy pixel circuits 32 may be provided with respect to one source line SL. For example, when the dummy pixel circuit array 34 has a structure of two rows and m columns, a configuration may be employed where the gate electrode of the transfer transistor T2 in the dummy pixel circuit 32 on the first row is connected to the dummy gate line GLdo, the drain electrode of the drive transistor T1 is connected to a dummy light emission voltage supply line VSLdo, the gate electrode of the transfer transistor T2 in the dummy pixel circuit 32 on the second row is connected to the dummy gate line GLde, the drain electrode of the drive transistor T1 is connected to a dummy light emission voltage supply line VSLde, control is made so as to keep the one dummy gate line GLde at the high voltage level VGL1 and bring the transfer transistor T2 in the dummy pixel circuit 32 on the even-number row into the ON state only in the transfer period Tt in the horizontal period Thi (i=even-number) for the even-number row, and control is made so as to keep the other dummy gate line GLdo at the high voltage level VGL1 and bring the transfer transistor T2 in the dummy pixel circuit 32 on the odd-number row into the ON state only in the transfer period Tt in the horizontal period Thi (i=odd-number) for the odd-number row.

<10> Further, in the above second embodiment, there has been adopted the configuration where the correction circuit 31 reads the correction amount ΔVadj by use of the LUT 35, namely the correction amount ΔVadj is derived by the digital processing, but in place of the LUT 35, there may be provided an analog circuit which takes the detected value of the ammeter 33 as an input and outputs the correction amount ΔVadj. In this case, when the correction processing by column is to be performed, the analog circuit is provided on each column, and when the batch correction processing is to be performed, the analog circuit is provided in each column group which is the unit of the batch correction processing. The same applies to the above other embodiments <3> and <4>.

<11> Further, in the above second embodiment, there has been employed the configuration where the correction amount ΔVadj is outputted from the LUT control circuit 36 to the source driver 12, as well as the configuration where the actual correction processing is performed on the luminance voltage Vsij of the source driver 12, but in place of the above configurations, there may be employed a configuration where the LUT 35 is made to previously store not the correction amount ΔVadj of the luminance voltage Vsij, but a correction amount with respect to the digital image signal DA for deriving the luminance voltage Vsij, the LUT control circuit 36 outputs the correction amount read from the LUT 35 to the display control circuit 11, and the display control circuit 11 corrects the digital image signal DA based on the correction amount and then outputs it to the source driver 12. The same applies to the above other embodiments <3> and <4>.

<12> Further, in the above second embodiment, there has been employed the configuration where the correction circuit 31 is provided within the display device 4, but at least the LUT 35 within the correction circuit 31 may be provided outside the display device 4. Moreover, in the case of providing the correction circuit 31 outside the display device 4, the source driver 12 may not perform the correction processing on the luminance voltage Vsij that is applied to the source line SLj, but may perform, in an external circuit, the correction processing on a data signal Ds that is to be inputted into the display device 4. The same applies to the above other embodiments <3> and <4>.

<13> Further, in the above second embodiment, the pixel circuit 2 with the circuit configuration of the equivalent circuit shown in FIG. 2 described in the first embodiment has been used as the pixel circuit 2 for use in the pixel circuit array 10, but in the configuration where the monitor circuit 30 and the correction circuit 31 are provided with respect to the pixel circuit array 10 and the above external compensation operation is performed, by also providing a similar monitor circuit 30 and correction circuit 31 with respect to the pixel circuit array 10 using a pixel circuit with a similar circuit configuration where the n-channel drive transistor forms the source follower circuit as in the pixel circuit 2, it is possible to compensate a temporal change in transistor characteristic of the drive transistor T1 in the pixel circuit with the similar circuit configuration.

Figure 13:
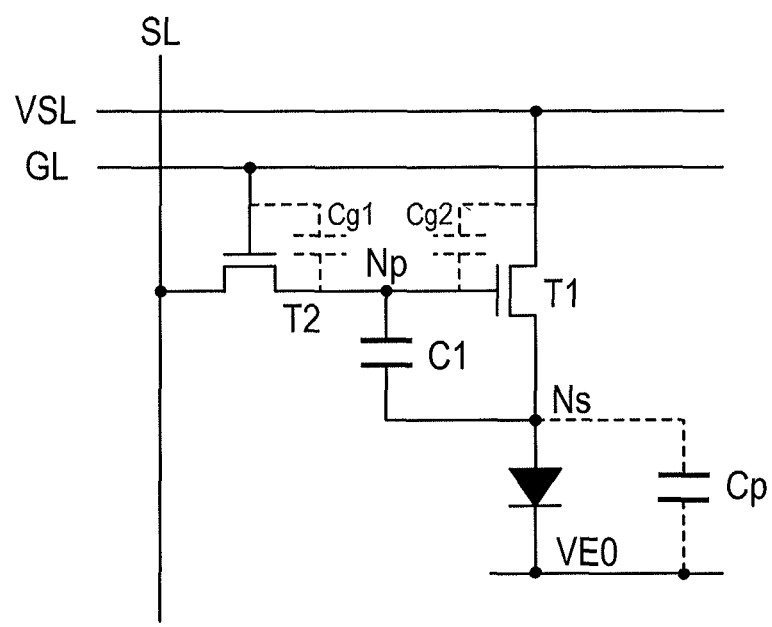
FIG. 13 is an equivalent circuit diagram showing one example of a pixel circuit of a conventional organic EL display device.
Figure 14:
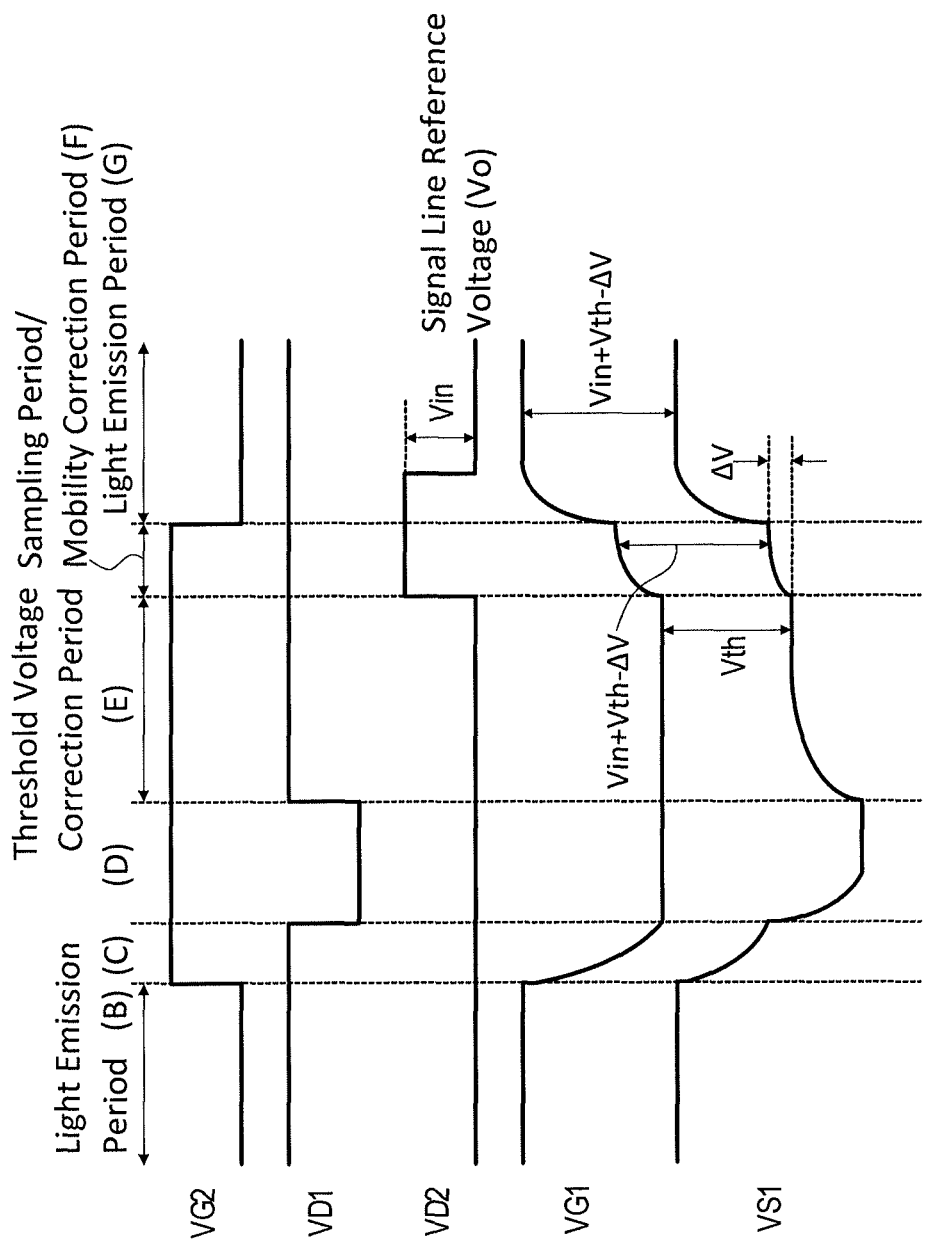
FIG. 14 is a timing diagram showing an operation sequence for the pixel circuit shown in FIG. 13.
Figure 15:
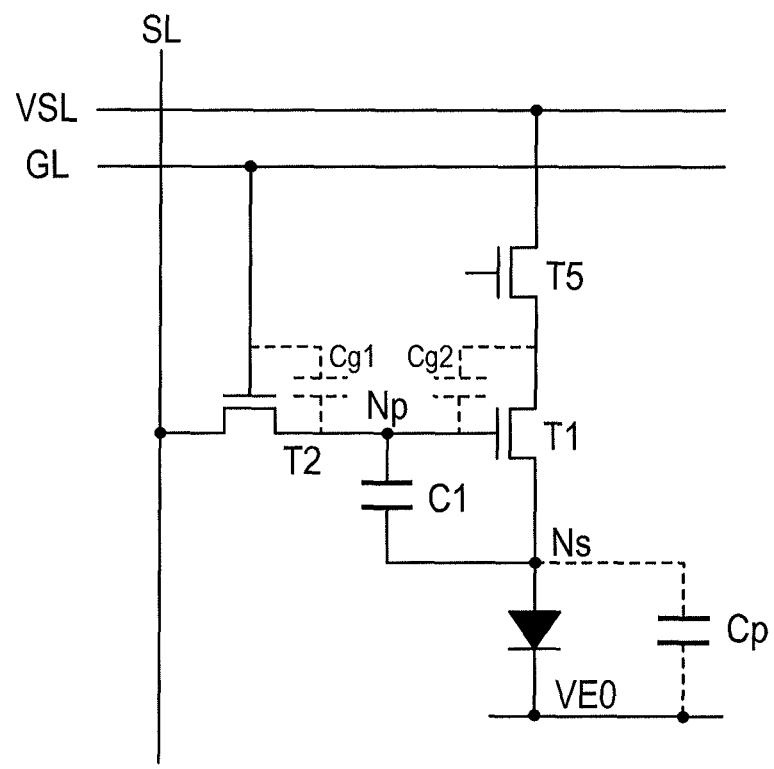
FIG. 15 is an equivalent circuit showing one example of the pixel circuit of the conventional organic EL display device.

For example, also with respect to the pixel circuit array made up of the conventional pixel circuits as shown in each of FIGS. 13 and 15, by providing the monitor circuit 30 and the correction circuit 31, the external compensation operation is performed, thereby to allow compensation for a temporal change in transistor characteristic of the drive transistor T1. Also in such a case, as in the above other embodiment <4>, it is preferable to provide the ammeter 33 on the corresponding source line SL and detect a current flowing in the drive transistor T1 in the dummy pixel circuit 32 from the source line SL side.

EXPLANATION OF REFERENCES 1 display device
2 pixel circuit
3 organic EL element (OLED)
10 pixel circuit array
11 display control circuit
12 source driver
13 gate driver
14 anode driver
20 active matrix substrate
21 reflective metal layer
22 ITO anode electrode layer
23 organic EL material layer
24 cathode electrode layer
25 color filter
30 monitor circuit
31 correction circuit
32 dummy pixel circuit
33 ammeter
34 dummy pixel circuit array
35 look up table (LUT)
36 LUT control circuit
C1 capacitance element
Cp parasitic capacitance of source electrode (reference node) of drive transistor
Ct timing signal
D1 diode
DA digital image signal
Dv data signal
GL (GL1, GL2, . . . , GLn) gate line
GLd dummy gate line
Gtc scan-side timing control signal
OLED organic light emitting element
Ns reference node (source electrode of drive transistor)
Np pixel node (gate electrode of drive transistor)
SL (SL1, SL2, . . . , SLm) source line
Stc data-side timing control signal
T1 drive transistor (first transistor element)
T2 transfer transistor (second transistor element, first switch circuit)
T3 control transistor (third transistor element, second switch circuit)
T4 monitor control transistor (third switch circuit)
Th1, Th2, . . . , Thn horizontal period
Tt transfer period
Ttd dummy transfer period
Tvb vertical blanking period
VE0 reference voltage that is applied to cathode electrode of OLED
VE1 first voltage level of light emission power supply voltage that is applied to light emission voltage supply line
VE2 second voltage level of light emission power supply voltage that is applied to light emission voltage supply line
VGL0 low voltage level of gate signal
VGL1 high voltage level of gate signal
VRL reference voltage supply line
VSL (VSL1, VSL2, . . . , VSLn) light emission voltage supply line
VSLd dummy light emission voltage supply line
Vx operating point of reference node

The invention claimed is:

1. A display device in which a plurality of pixel circuits are arranged in a row direction and a column direction to constitute a pixel circuit array,
the pixel circuit comprising:
a light emitting element which emits light by a light emission current flowing from an anode electrode to a cathode electrode;
a first transistor element of an n-channel insulated gate thin-film transistor that has a source electrode connected with the anode electrode of the light emitting element, a gate electrode connected with a pixel node, and controls the light emission current in accordance with a light emission control voltage between the gate electrode and the source electrode;
a first switch circuit which is interposed between a data signal line and the pixel node and is controlled for conduction/non-conduction in accordance with a voltage level of a first control terminal connected with a scan signal line;
a second switch circuit which is interposed between the source electrode and a drain electrode of the first transistor element and is controlled for conduction/non-conduction in accordance with a voltage level of a second control terminal connected with the scan signal line, and comes into a conduction state at the time of conduction of the first switch circuit in accordance with a voltage level of the scan signal line, to selectivity short-circuit between the source electrode and the drain electrode of the first transistor; and
a capacitance element which is interposed between the gate electrode and the source electrode of the first transistor element, and holds the light emission control voltage,
wherein the pixel circuits arranged on an identical column each have one end of the first switch circuit connected to the data signal line extending in the column direction along the identical column, and
the pixel circuits arranged on an identical row each have the first control terminal of the first switch circuit and the second control terminal of the second switch circuit connected to the scan signal line extending in the row direction along the identical row, and the drain electrode of the first transistor element connected to a light emission voltage supply line extending in the row direction along the identical row,
the display device comprising:
a data signal line drive circuit which individually drives the data signal line provided in plural;
a scan signal line drive circuit which individually drives the scan signal line provided in plural;
a light emission voltage supply line drive circuit which individually drives the light emission voltage supply line provided in plural;
a monitor circuit which has a dummy pixel circuit configured by removing at least the light emitting element from the pixel circuit, and detects a current flowing between the drain electrode and the source electrode of the first transistor element provided in the dummy pixel circuit, to perform simulation monitoring of a change in electric characteristic of the first transistor element in the pixel circuit; and
a correction circuit which corrects a voltage level of the data signal line driven by the data signal line drive circuit based on a current amount detected by the monitor circuit or a value equivalent to the current amount.

2. A display device, in which
a plurality of pixel circuits are arranged in a row direction and a column direction to constitute a pixel circuit array,
the pixel circuit comprising at least:
a light emitting element which emits light by a light emission current flowing from an anode electrode to a cathode electrode;
a first transistor element of an n-channel insulated gate thin-film transistor that has a source electrode connected with the anode electrode of the light emitting element, a gate electrode connected with a pixel node, and controls the light emission current in accordance with a light emission control voltage between the gate electrode and the source electrode;
a first switch circuit which is interposed between a data signal line and the pixel node and is controlled for conduction/non-conduction in accordance with a voltage level of a first control terminal connected with a scan signal line; and
a capacitance element which is interposed between the gate electrode of the first transistor element and the source electrode or a drain electrode of the first transistor element,
the pixel circuits arranged on an identical column each have one end of the first switch circuit connected to the data signal line extending in the column direction along the identical column, and
the pixel circuits arranged on an identical row each have the first control terminal of the first switch circuit connected to the scan signal line extending in the row direction along the identical row, and the drain electrode of the first transistor element connected directly or via another circuit element to a light emission voltage supply line extending in the row direction along the identical row,
the display device comprising:
a data signal line drive circuit which individually drives the data signal line provided in plural;
a scan signal line drive circuit which individually drives the scan signal line provided in plural;
a light emission voltage supply line drive circuit which individually drives the light emission voltage supply line provided in plural;
a monitor circuit which has a dummy pixel circuit configured by removing at least the light emitting element from the pixel circuit, and detects a current flowing between the drain electrode and the source electrode of the first transistor element provided in the dummy pixel circuit, to perform simulation monitoring of a change in electric characteristic of the first transistor element in the pixel circuit; and
a correction circuit which corrects a voltage level of the data signal line driven by the data signal line drive circuit based on a current amount detected by the monitor circuit or a value equivalent to the current amount.

3. The display device according to claim 2, wherein
the monitor circuit includes at least one dummy pixel circuit of claim 2, in which one end of the first switch circuit is connected to at least one data signal line, and
the first control terminal of the first switch circuit in the dummy pixel circuit is connected to a dummy scan signal line.

4. The display device according to claim 3, wherein the dummy scan signal line is driven every time each of the scan signal lines on a plurality of rows is sequentially driven by the scan signal line drive circuit in order to simultaneously bring the first switch circuits in the pixel circuits on an identical row into a conduction state.

5. The display device according to claim 3, wherein the dummy pixel circuit is configured by removing at least the light emitting element from the pixel circuit and by including a third switch circuit which is interposed between a corresponding one of the data signal lines and the drain electrode of the first transistor element, the third switch circuit being controlled for conduction/non-conduction in accordance with a voltage level of a third control terminal connected with a monitor control signal line.

6. The display device according to claim 3, wherein
the monitor circuit includes the dummy pixel circuit, in which one end of the first switch circuit is connected to the data signal line, with respect to each of the data signal lines, and
the first control terminal of the first switch circuit in each dummy pixel circuit is connected to the dummy scan signal line extending in the row direction.

7. The display device according to claim 2, wherein
the dummy pixel circuit is configured by removing at least the light emitting element and the first switch circuit from the pixel circuit, and
the monitor circuit includes at least one dummy pixel circuit of claim 2, in which the gate electrode of the first transistor element is connected to at least one data signal line.

8. The display device according to claim 7, wherein the monitor circuit includes the dummy pixel circuit, in which the gate electrode of the first transistor element is connected to the data signal line, with respect to each of the data signal lines.

9. The display device according to claim 6, wherein the correction circuit individually corrects a voltage level of a corresponding one of the data signal lines driven by the data signal line drive circuit with respect to each of the data signal lines based on a current amount of a current outputted individually from the source electrode of the first transistor element in the dummy pixel circuit connected to the data signal line, or a value equivalent to the current amount.

10. The display device according to claim 6, wherein the correction circuit collectively corrects voltage levels of all of the data signal lines driven by the data signal line drive circuit based on a total or an average of current amounts of currents outputted respectively from the source electrodes of the first transistor elements in the dummy pixel circuits in the same number as the data signal lines, or a total or an average of values equivalent to the current amounts, or some other statistic value.

11. The display device according to claim 2, wherein the monitor circuit detects a current outputted from the source electrode of the first transistor element provided in the dummy pixel circuit within a vertical blanking period.

12. The display device according to claim 11, wherein, within the vertical blanking period,
in a dummy transfer period set to be a period before the monitor circuit detects a current outputted from the source electrode of the first transistor element in the dummy pixel circuit,
the data signal line drive circuit supplies a reference luminance voltage for monitoring to the data signal line connected with one end of the first switch circuit in the dummy pixel circuit,
the first switch circuit in the dummy pixel circuit is controlled in a conduction state, and the reference luminance voltage is transferred from the data signal line to the pixel node in the dummy pixel circuit.

13. The display device according to claim 1, wherein
the monitor circuit includes at least one dummy pixel circuit of claim 1, in which one end of the first switch circuit is connected to at least one data signal line, and
the first control terminal of the first switch circuit in the dummy pixel circuit is connected to a dummy scan signal line.

14. The display device according to claim 1, wherein
the dummy pixel circuit is configured by removing the first switch circuit from the pixel circuit, and
the monitor circuit includes at least one dummy pixel circuit of claim 1, in which the gate electrode of the first transistor element is connected to at least one data signal line.

15. The display device according to claim 1, wherein
the cathode electrode of the light emitting element is connected with a reference voltage supply line,
a level of a voltage that is supplied to the light emission voltage supply line is kept at a first voltage level which does not allow the light emitting element to emit light, with a voltage of the reference voltage supply line taken as a reference, in a transfer period in which the first switch circuit is brought into a conduction state in accordance with a voltage level of the scan signal line and a luminance voltage that is based on luminance of the light emitting element and supplied from the data signal line is transferred to the pixel node, and
the level of the voltage that is supplied to the light emission voltage supply line is kept at a second voltage level which is sufficient for allowing the light emission current to flow in the light emitting element, with the voltage of the reference voltage supply line taken as a reference in a light emission period in which the first switch circuit is brought into a non-conduction state in accordance with a voltage level of the scan signal line, the light emission control voltage is held in the capacitance element, the light emitting current based on the light emission control voltage is allowed to flow, and the light emitting element thereby emits light.

16. The display device according to claim 1, wherein
the first switch circuit is a second transistor element of an n-channel insulated gate thin-film transistor with a gate electrode being the first control terminal, a source electrode of the second transistor element is connected with the pixel node, and a drain electrode of the second transistor element is connected with the data signal line, and
the second switch circuit is a third transistor element of an n-channel insulated gate thin-film transistor with a gate electrode being the second control terminal, a source electrode of the third transistor element is connected with the source electrode of the first transistor element, and a drain electrode of the third transistor element is connected with the drain electrode of the first transistor element.

17. The display device according to claim 1, wherein the first transistor element is an oxide semiconductor transistor.

18. The pixel circuit according to claim 16, wherein at least the first transistor element and the second transistor element out of the first to third transistor elements are oxide semiconductor transistors.

19. The pixel circuit according to claim 1, wherein the drain electrode of the first transistor element provided in the dummy pixel circuit is electrically connected to a different line other than the light emission voltage supply line.

20. The pixel circuit according to claim 2, wherein the drain electrode of the first transistor element provided in the dummy pixel circuit is electrically connected to a different line other than the light emission voltage supply line.

* * * * *